(12) United States Patent
Ichikawa

(10) Patent No.: US 7,938,005 B2
(45) Date of Patent: May 10, 2011

(54) ACCELERATION SENSOR CHIP PACKAGE

(75) Inventor: Shunji Ichikawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 8 days.

(21) Appl. No.: 12/607,407

(22) Filed: Oct. 28, 2009

(65) Prior Publication Data
US 2010/0043553 A1 Feb. 25, 2010

Related U.S. Application Data

(62) Division of application No. 11/253,543, filed on Oct. 20, 2005, now Pat. No. 7,334,476.

(30) Foreign Application Priority Data

Oct. 22, 2004 (JP) .................................. 2004-308478

(51) Int. Cl.
*G01P 15/08* (2006.01)
(52) U.S. Cl. .................................. 73/514.33; 73/514.38
(58) Field of Classification Search ............... 73/514.01, 73/514.33, 514.38
See application file for complete search history.

(56) References Cited

U.S. PATENT DOCUMENTS

| | | | |
|---|---|---|---|
| 6,263,735 B1 | 7/2001 | Nakatani et al. | |
| 6,316,840 B1 | 11/2001 | Otani | |
| 6,405,592 B1 | 6/2002 | Murari et al. | |
| 6,876,093 B2 | 4/2005 | Goto et al. | |
| 7,267,007 B2 | 9/2007 | Nakamura | |
| 7,296,471 B2 * | 11/2007 | Ono et al. | 73/514.36 |
| 7,650,787 B2 * | 1/2010 | Ino | 73/514.33 |

FOREIGN PATENT DOCUMENTS

JP 11-135804 A 5/1999

* cited by examiner

*Primary Examiner* — John E Chapman
(74) *Attorney, Agent, or Firm* — Kubotera & Associates LLC

(57) ABSTRACT

An acceleration sensor chip package includes an acceleration sensor chip; a sensor control chip; a re-wiring layer; an outer terminal; a sealing portion; and a substrate. The acceleration sensor chip includes a frame portion; a movable structure; a detection element; and an electrode pad electrically. The re-wiring layer has a wiring portion connected to the electrode pad. The electrode pad is electrically connected to a conductive bump. The sensor control chip has a sensor control electrode pad electrically connected to the conductive bump. The outer terminal is connected to the wiring portion and disposed in the outer region. The sealing portion seals the sensor control chip, the electrode pad, and the re-wiring layer, so that the movable structure is movable. The substrate is attached to the acceleration sensor chip to seal an opening portion.

2 Claims, 16 Drawing Sheets

Fig. 7(A)
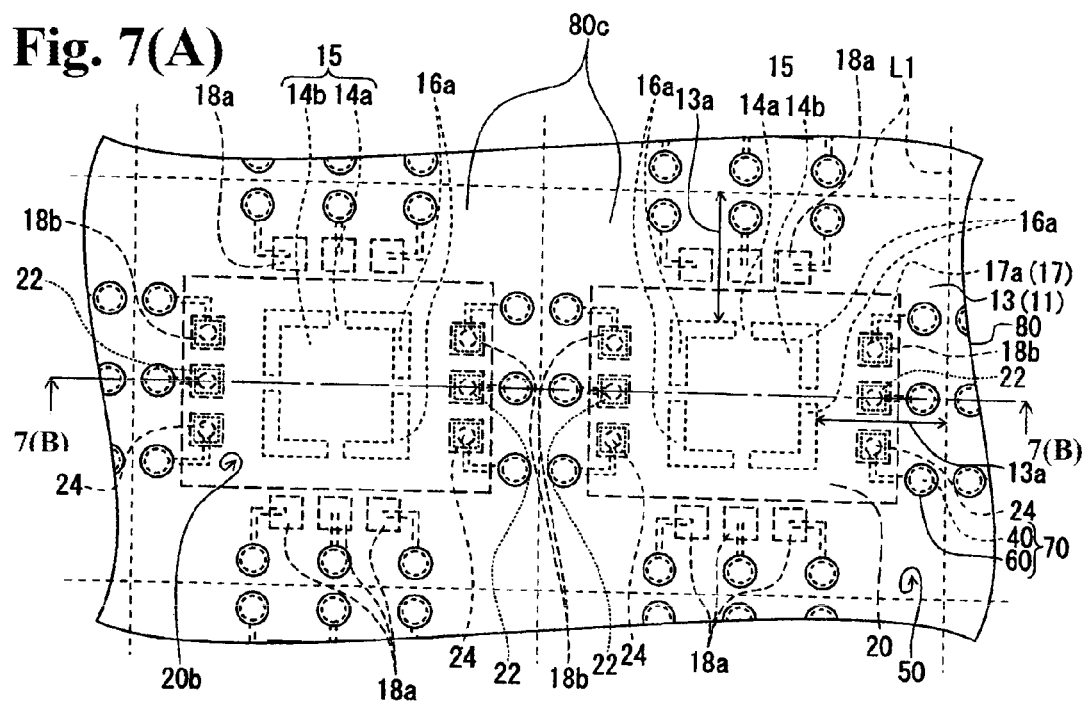
Fig. 7(B)
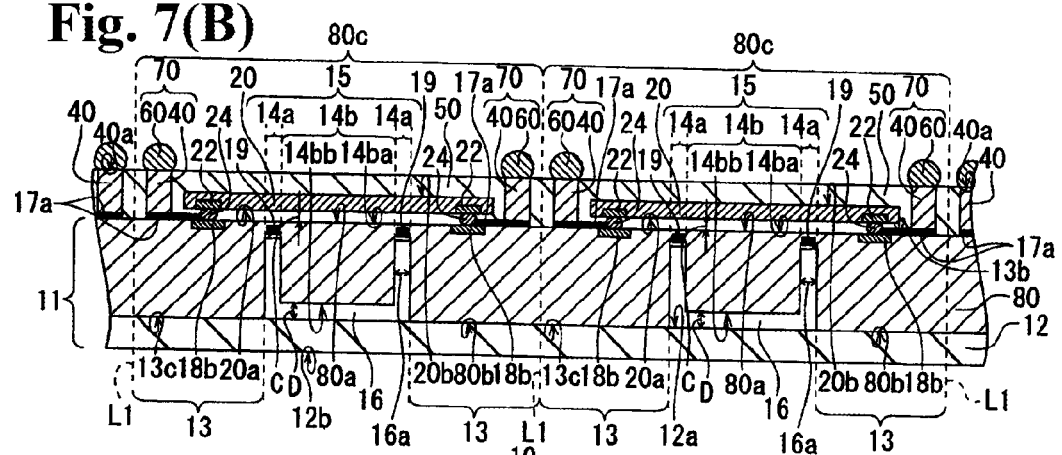
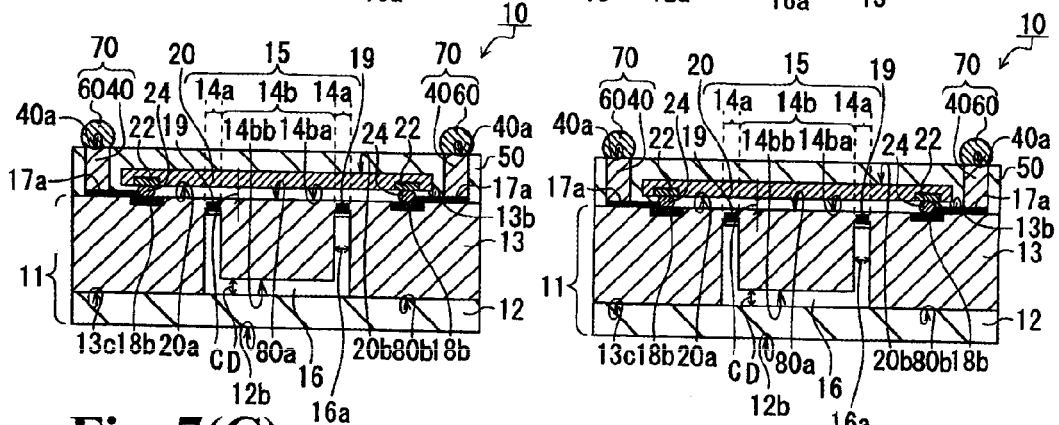
Fig. 7(C)

US 7,938,005 B2

ACCELERATION SENSOR CHIP PACKAGE

CROSS-REFERENCE TO RELATED APPLICATIONS

This is a divisional application of U.S. patent application Ser. No. 12/005,370 filed on Dec. 27, 2007 as a divisional application of the prior application Ser. No. 11/253,543 filed on Oct. 20, 2005, granted as U.S. Pat. No. 7,334,476 on Feb. 26, 2008.

The disclosure of Japanese Patent Application No. 2004-308478, filed on Oct. 22, 2004, is incorporated in the application by reference.

BACKGROUND OF THE INVENTION AND RELATED ART STATEMENT

The present invention relates to an acceleration sensor chip package.

Recently, technology for producing a microstructure having a size of a few hundred microns has been advanced using micro-machining technology based on semiconductor manufacturing technology. The technology has been applied to various sensors, for example, photo-switches in an optical communication system, and radio frequency (RF) components. Since such a microstructure can be produced with a conventional semiconductor manufacturing process, it is possible to mount a large number of microstructures on a single chip.

Such a chip formed of the microstructures having a system with a specific function is called Micro-Electrical-Mechanical-Systems (MEMS) or Micro-System-Technology (MIST; referred to as an MEMS device hereinafter). The MEMS device includes an acceleration sensor (see Patent Reference 1).

Patent Reference 1: Japanese Patent Publication No. 11-135804

In Patent Reference 1, the acceleration sensor is a piezotype, and has a frame portion formed of a center portion and a beam portion. The beam portion extends at least between a portion of an inner circumferential side surface of the frame portion and the center portion. A weight portion (movable portion) is supported on the center portion to be freely movable. A supporting portion is provided for supporting a lower surface of the frame portion, and surrounds an outer circumferential edge of the weight portion through a cut portion thereof. The movable portion is integrated with the frame portion to form a microstructure, and moves upon receiving an external force. The frame portion has a small thickness and a small width. Such a sensor chip is generally formed as a packaged device.

With reference to FIGS. 16(A) and 16(B), a conventional acceleration sensor chip package will be explained. FIG. 16(A) is a schematic plan view showing the conventional acceleration sensor chip package viewed from an upper surface side for explaining constituents. An upper surface of a protection cover (described later) is omitted to provide a transparent view for showing an internal configuration. FIG. 16(B) is a schematic sectional view taken along a projected line 16(B)-16(B) in FIG. 16(A).

As shown in FIG. 16(A), a conventional acceleration sensor chip package 100 is provided with an acceleration sensor chip 110. The acceleration sensor chip 110 is provided with electrode pads 112 for outputting a signal from the acceleration sensor chip 110 or inputting a signal to the acceleration sensor chip 110. The acceleration sensor chip 110 is also provided with a movable structure 114 operating mechanically, and a sealing substrate 116 for sealing the movable structure 114 to regulate a movement thereof. As shown in FIG. 16(B), the sealing substrate 116 is attached to a substrate 120 with an adhesive 122.

An edge of an opening of a protection cover 130 is attached to the substrate 120, so that the protection cover 130 forms a closed space 140 for sealing the acceleration sensor chip 110. Outer terminals 150 are disposed at an edge of the substrate 120, and extend outwardly from inside the closed space 140 formed by the protection cover 130. In the closed space 140, the outer terminals 150 are electrically connected to the electrode pads 120 of the acceleration sensor chip 110 through bonding wires 160.

In the conventional acceleration sensor chip package described above, the acceleration sensor chip is electrically connected to the outer terminals through the bonding wires. The protection cover is provided for sealing the acceleration sensor chip while retaining the bonding wires. Accordingly, it is difficult to seal the acceleration sensor chip through transfer molding or potting using a liquid resin, thereby increasing a size of the acceleration sensor chip package.

Further, when the conventional acceleration sensor chip package is produced, the acceleration sensor chip is packaged after dicing. Accordingly, a cut waste may stick to an area around the movable portion (weight) upon dicing, so that the movable portion may be damaged and not operate properly.

In view of the problems described above, an object of the present invention is to provide an acceleration sensor chip package having a small size. Further, an object of the present invention is to provide a method of producing an acceleration sensor chip package in a simple process while preventing a movable portion from being damaged, thereby increasing a product yield.

Further objects and advantages of the invention will be apparent from the following description of the invention.

SUMMARY OF THE INVENTION

In order to attain the objects described above, according to the present invention, an acceleration sensor chip package includes an acceleration sensor chip; a sensor control chip; a re-wiring layer; an outer terminal; a sealing portion; and a substrate. The acceleration sensor chip includes a frame portion having an upper surface and a lower surface opposite to the upper surface and including an inner region with an opening portion extending from the upper surface to the lower surface and an outer region surrounding the inner region; a movable structure having a beam portion extending from the frame portion toward inside the opening portion, and a movable portion disposed in the opening portion and supported on the beam portion to be movable; a detection element for detecting a movement of the movable structure; and an electrode pad electrically connected to the detection element and exposed on the upper surface of the frame.

The re-wiring layer has a wiring portion extending in the outer region and having one end electrically connected to the electrode pad. The electrode pad is electrically connected to a conductive bump.

The sensor control chip has a first surface and a second surface opposite to the first surface. The sensor control chip further includes a sensor control electrode pad exposed from the first surface and electrically connected to the conductive bump. The outer terminal is connected to the other end of the wiring portion and disposed in the outer region.

The sealing portion is disposed on the acceleration sensor chip such that the outer terminal is exposed for sealing the sensor control chip, the electrode pad, and the re-wiring layer, so that the movable structure is movable. The substrate is attached to a lower surface of the acceleration sensor chip to seal the opening portion from below.

According to the present invention, a method of producing an acceleration sensor chip package includes the steps of: preparing a semiconductor substrate having a plurality of intermediate acceleration sensors arranged in a matrix pattern each having an electrode pad and a movable structure disposed in an opening portion; attaching a substrate to a lower surface of the semiconductor substrate; forming a re-wiring layer having a wiring portion with one end electrically connected to the electrode pad arranged on the semiconductor substrate outside the opening portion; forming an outer terminal connected to the other end of the wiring portion on the semiconductor substrate outside the opening portion; forming a sensor control chip having a first surface, a second surface opposite to the first surface, and a sensor control electrode pad exposed from the first surface, so that the electrode pad is connected to a conductive bump, and the conductive bump is connected to the sensor control electrode pad facing the electrode pad; forming a sealing portion on the semiconductor substrate for sealing the sensor control chip, the electrode pad, and the re-wiring layer such that the outer terminal is exposed; and cutting the sealing portion, the semiconductor substrate, and the substrate at an area between the intermediate acceleration sensors to form the acceleration sensor chip package as a piece.

In the present invention, the outer terminal is produced with the manufacturing process called Wafer Level Chip Size Package (W-CSP). Accordingly, it is possible to make an outer size of the acceleration sensor chip package same as a size of the acceleration sensor chip, thereby greatly reducing the size of the acceleration sensor chip package. In particular, the sensor control chip is attached to the acceleration sensor chip with the conductive bump through a flip-chip connection. Accordingly, it is possible to reduce a thickness of the package. With the sensor control chip, it is possible to provide the package with high functionality and value.

In the method of the present invention, the microstructure having the movable portion is sealed before the dicing process. That is, when the dicing process is performed, the movable portion is sealed in a closed space. Accordingly, it is possible to prevent a cut waste or dust from sticking to the microstructure having the movable portion. As a result, it is possible to prevent damage on the microstructure during the manufacturing process with the simple steps, and to efficiently produce the acceleration sensor chip package with high yield.

BRIEF DESCRIPTION OF THE DRAWINGS

FIG. 7(A) is a schematic plan view showing the acceleration sensor chip package during the manufacturing process continued from FIG. 6(A), FIG. 7(B) is a sectional view taken along a projected line 7(B)-7(B) in FIG. 7(A), and FIG. 7(C) is a schematic sectional view showing the acceleration sensor chip package upon completion of the manufacturing process;

DETAILED DESCRIPTION OF PREFERRED EMBODIMENTS

Figure 1A:
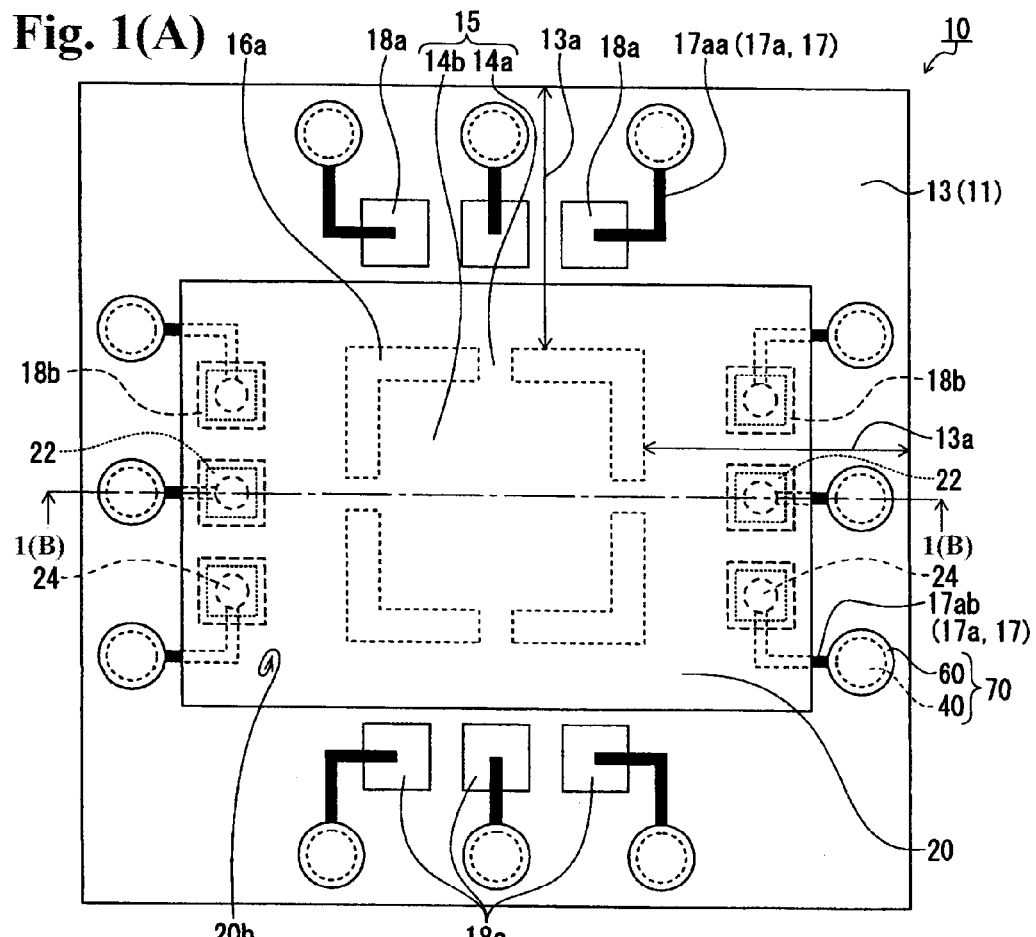
FIG. 1(A) is a schematic plan view showing an acceleration sensor chip package for explaining constituents thereof according to a first embodiment of the present invention.

Hereunder, embodiments of the present invention will be explained with reference to the accompanying drawings. The drawings schematically show shapes, sizes, and positional relationships of constituents, and the invention is not limited to those shown in the drawings. In the drawings, a size, a shape, and an arrangement of constituting components are schematically shown for explanation of the present invention. Specific materials, conditions, and numerical conditions described in the following description are just examples. In the following description, same reference numerals denote similar components, and explanations thereof may be omitted.

First Embodiment

A configuration of an acceleration sensor chip package according to a first embodiment of the present invention will be explained with reference to FIGS. 1(A), 1(B), 2(A), and 2(B). In the first embodiment, the acceleration sensor chip package includes a piezo-type acceleration sensor chip with a piezo-resistance as a functional element. The acceleration sensor chip is a semiconductor chip capable of measuring specific acceleration. The acceleration sensor chip package is a packaged device including such an acceleration sensor chip.

Figure 1B:
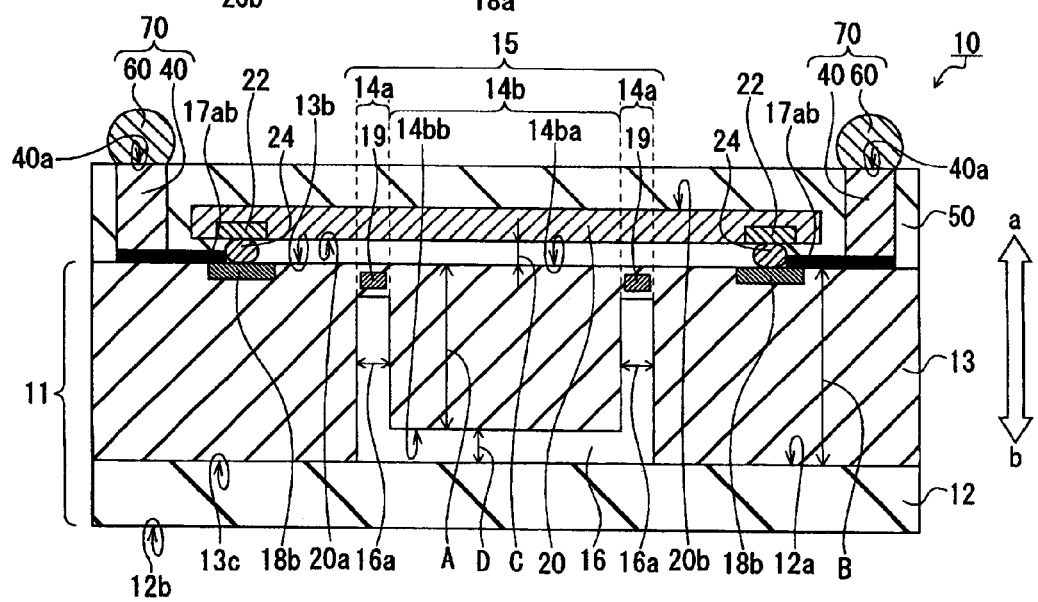
FIG. 1(B) is a sectional view taken along a projected line 1(B)-1(B) in FIG. 1(A)
Figure 2A:
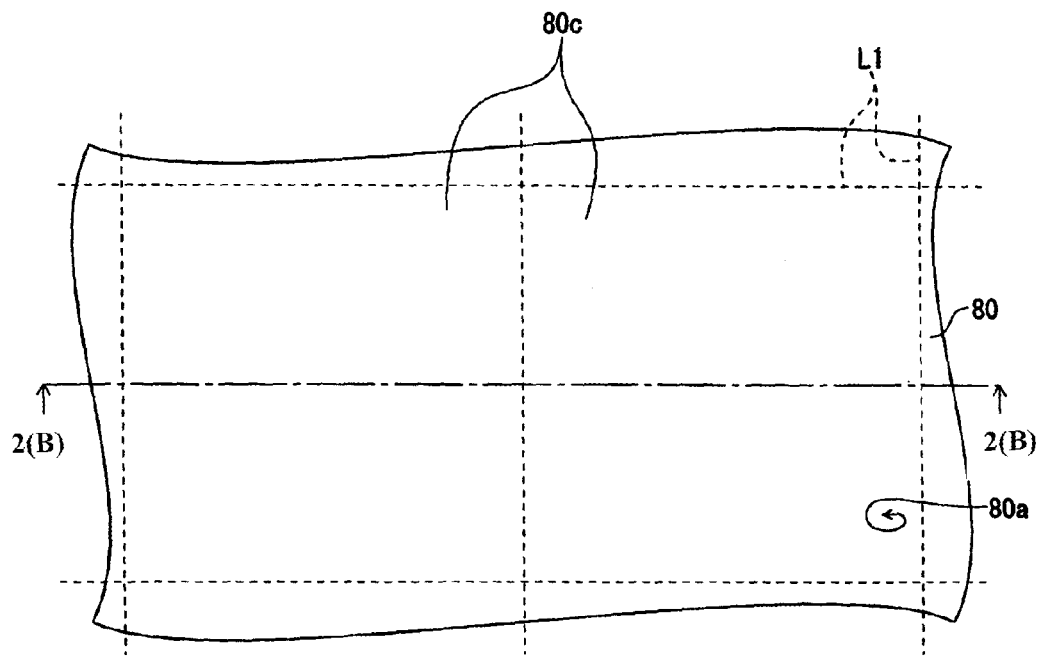
FIG. 2(A) is a schematic plan view of the acceleration sensor chip package during a manufacturing process.
Figure 2B:
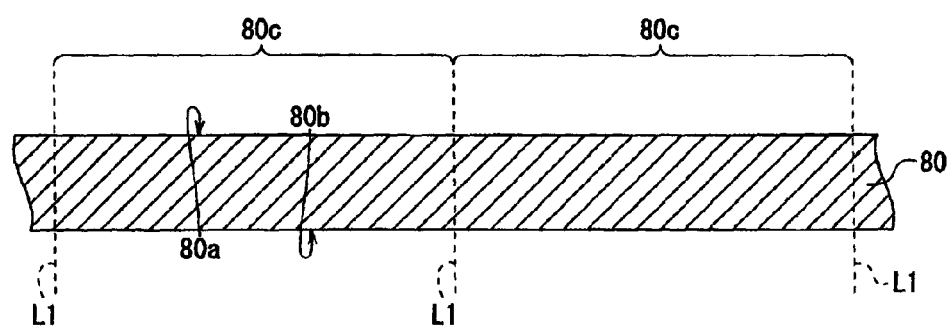
FIG. 2(B) is a sectional view taken along a projected line 2(B)-2(B) in FIG. 2(A)

FIG. 1(A) is a schematic plan view showing the acceleration sensor chip package for explaining constituents thereof according to the first embodiment of the present invention. In FIG. 1(A), a sealing portion (described later) disposed on a top of the acceleration sensor chip package is omitted for the explanation. FIG. 1(B) is a sectional view taken along a projected line 1(B)-1(B) in FIG. 1(A). FIG. 2(A) is a schematic plan view of the acceleration sensor chip package during a manufacturing process, and FIG. 2(B) is a sectional view taken along a projected line 2(B)-2(B) in FIG. 2(A).

As shown in FIGS. 1(A) and 1(B), an acceleration sensor chip package 10 is provided with an acceleration sensor chip 11. The acceleration sensor chip 11 is provided with a frame portion 13 having an inner region and an outer region 13a. The frame portion 13 also has an upper surface 13b and a lower surface 13c opposite to the upper surface 13b. In the embodiment, the frame portion 13 forms an outer frame with a rectangular shape defining an outer shape (contour) of the acceleration sensor chip 11.

The acceleration sensor chip 11 is provided with an opening portion 16 at the inner region of the frame portion 13 (hereunder, the opening portion 16 may be also referred to as an inner region 16). In the embodiment, the opening portion 16 is surrounded by the outer region 13a of the frame portion 13, i.e., a through hole extending from the upper surface 13b to the lower surface 13c of the frame portion 13. The acceleration sensor chip 11 is also provided with a movable structure 15 having a beam portion 14a and a movable portion 14b. The movable portion 14b is integrated with the beam portion 14a to be movable. The beam portion 14a extends from the frame portion 13 into the opening portion 16. The beam portion 14a has a small thickness and a small width, and functions as a flexible portion deforming when the movable portion 14b moves.

The movable portion 14b is disposed at a distal end of the beam portion 14a protruding into the opening portion 16, and hangs downwardly with the beam portion 14a and is disposed inside the opening portion 16. An upper surface 14ba of the movable portion 14b is situated at a height substantially same as that of the beam portion 14a and the frame portion 13. The movable portion 14b has a thickness A smaller than a thickness B of the frame portion 13. That is, the movable portion 14b is supported inside the opening portion 16 with the beam portion 14a.

The movable structure 15 may be disposed in, for example, a silicon wafer. The frame portion 13 is integrated with the beam portion 14a, so that the frame portion 13 supports the beam portion 14a at the connected portions thereof, and the beam portion 14a supports the movable portion 14b.

It is necessary to arrange the movable portion 14b to be movable in an arrow direction a or an arrow direction b shown in FIG. 1(B) for measuring acceleration. Accordingly, the movable portion 14b is separated from the frame portion 13 with a gap 16a and from side edges of the beam portion 14a except connected portions between the frame portion 13 and the movable portion 14b, so that the movable portion 14b does not directly contact with the frame portion 13, and the beam portion 14a does not interfere the movement of the movable portion 14b.

In the embodiment, the movable structure 15 is formed of the beam portion 14a having the four components and the movable portion 14b supported in four directions with the four components of the beam portion 14a. According to the present invention, the configuration of the acceleration sensor chip package is not limited to the embodiment, and may be applicable to configurations of any movable structures disposed in conventional acceleration sensors. For example, the configuration of the acceleration sensor chip package is applicable to a cantilever configuration in which the movable portion 14b is supported in one direction.

The acceleration sensor chip package 10 has a size same as an outer size of the acceleration sensor chip 11 in a plan view viewed from an upper surface thereof (or a lower surface). The acceleration sensor chip package 10 has a rectangular column shape, and not limited thereto. As shown in FIGS. 1(A) and 1(B), the beam portion 14a is formed of the four components protruding into the opening portion 16 from the center of each side of the upper surface 13b of the frame portion 13. The movable portion 14b is supported at distal end portions of the four components of the beam portion 14a. In the embodiment, the movable portion 14b has a cubical shape. That is, the beam portion 14a has a rectangular shape in a plan view, and the beam portion 14a is connected to center portions of four sides of a square, i.e., an upper surface of the cubic. Alternatively, the movable portion 14b may have another shape according to estimated acceleration and measurement conditions.

In the embodiment, the beam portion 14a is provided with detection elements 19 or piezo-resistance elements. An appropriate number of the detection elements 19 are disposed at appropriate positions according to a design for measuring acceleration as a measurement target. The detection elements 19 measure displacement (acceleration) of the movable structure 15, and are not limited to the piezo-resistance elements. For example, a detection element used in an arbitrary acceleration sensor such as an electrostatic type may be applicable.

Each of the detection elements 19 is connected to a wiring (not shown) for outputting a signal to outside or inputting a signal to the detection elements 19. The wiring may be formed of a known configuration and a known material such as aluminum (Al). A plurality of electrode pads 18 is disposed on the outer region 13a of the frame portion 13 outside the opening portion 16 in an exposed state from the frame portion 13.

Each of the electrode pads 18 includes a first electrode pad 18a and a second electrode pad 18b arranged along sides defining the outer contour of the frame portion 13. More specifically, in the embodiment, the first electrode pads 18a are arranged along two opposing sides, and the second electrode pads 18b are arranged along other two opposing sides. The first electrode pad 18a is electrically connected to the piezo-resistance element 19 on the beam portion 14a through a wiring (not shown). The second electrode pad 18b may be or may not be electrically connected to the piezo-resistance element 19 on the beam portion 14a through a wiring (not shown).

A sensor control chip 20 is mounted on the acceleration sensor chip 11, and functions as a semiconductor chip performing an electrical operation to control an operation of the acceleration sensor chip. The sensor control chip 20 is formed of a chip having one or more than two functions properly selected from amplifier function, angle calibration function, AD conversion function, DA conversion function, and memory function.

The sensor control chip 20 has a first surface 20a and a second surface 20b opposite to the first surface 20a. A plurality of sensor control electrode pads 22 is disposed on the first surface 20a in an exposed state. In the embodiment, the sensor control electrode pads 22 are arranged along a circumference of the sensor control chip 20.

The sensor control chip 20 is mounted on the acceleration sensor chip 11 such that the first surface 20a faces the upper surface 14ba of the movable portion 14b. At this time, the second electrode pad 18b arranged along the opposing sides of the acceleration sensor chip 11 are individually connected to the sensor control electrode pads 22 through conductive bumps 24. That is, the sensor control chip 20 is flip-chip connected on the acceleration sensor chip 11. The conductive bumps 24 are formed of, for example, solder bumps containing known tin (Su) and lead (Pb).

Accordingly, the sensor control chip 20 is separated from the movable portion 14b and mounted on the acceleration sensor chip 11. The sensor control chip 20 seals the movable structure 15, i.e., the beam portion 14a and the movable portion 14b, from an upper surface side of the opening portion 16 (gaps 16), i.e., a side of the upper surface 14ba of the movable portion 14b. The sensor control chip 20 has a function of sealing and protecting the movable structure 15 and restricting the movable portion 14a to move from a bottom surface 14bb to the upper surface 14ba thereof, in addition to the function as the chip described above.

The conductive bumps 24 have a height equal to or grater than a height C between the sensor control chip 20 and the upper surface 14ba of the movable portion 14b shown in FIG. 1(B), so that the movement of the movable portion 14b in the allow direction is not restricted to measure target acceleration. The sensor control chip 20 has an outer side arbitrarily selected according to an arrangement of an outer terminal and production of a sealing portion (described later).

A re-wiring layer 17 is disposed on the upper surface 13b of the frame portion 13. The re-wiring layer 17 includes a plurality of wiring portions 17a. One end of the wiring portion 17a is electrically connected to the electrode pad 18, i.e., one of the first electrode pad 18a and the second electrode pad 18b. The wiring portions 17a connected to the first electrode pads 18a may be called first wiring portions 17aa, and the wiring portions 17a connected to the second electrode pads 18b may be called second wiring portions 17ab. The other end of the wiring portion 17a, i.e., the upper surface 13b of the frame portion 13, is electrically connected to an outer terminal 70. The re-wiring layer 17 is preferably formed of a metal wiring such as copper (Cu).

Accordingly, the outer terminal 70 is electrically connected to the piezo-resistance element 19 through the re-wiring layer 17, the first electrode pad 18a connected to the re-wiring layer 17, and a wiring (not shown) connected to the first electrode pad 18a. Further, the outer terminal 70 is electrically connected to the sensor control chip 20 through the re-wiring layer 17, the second electrode pad 18a connected to the re-wiring layer 17, the conductive bump 24, and the sensor control electrode pad 22 connected to the conductive bump 24.

In the embodiment, the outer terminal 70 is formed of an electrode post 40 electrically connected to the other end of the wiring portion 17a and a solder ball 60 electrically connected to a top surface 40a of the electrode post 40. The outer terminals 70 function as a terminal for inputting and outputting a signal from an mounting substrate and an external device for the operation of the acceleration sensor chip, a signal applied to a power source, or a signal from the acceleration sensor chip package 10.

The solder ball 60 is formed of an arbitral material such as a lead-free solder ball and a core-ball. Alternatively, the outer terminal 70 may be formed in a land shape without the solder ball 60. That is, the outer terminal 70 may be formed in an appropriate shape according to a requirement of a mounting substrate on which the acceleration sensor chip package 10 is mounted. For example, when the electrode post 40 is formed of copper, a thin layer formed of nickel (Ni) may be formed on the top surface 40a of the electrode post 40. Then, a thin layer formed of gold (Au) is formed on the nickel thin layer. Alternatively, a solder paste is applied to the top surface 40a to form a land.

A sealing portion 50 is disposed on the acceleration sensor chip 11 for sealing the sensor control chip 20, the conductive bumps 24, and the re-wiring layer 17. The sealing portion 50 extends outside the opening portion 16 to cover the outer region 13a, so that the movement of the movable structure 15 is not interfered. The sealing portion 50 contacts with outer surfaces of the conductive bumps 24 (end edge of the acceleration sensor chip 11) in the outer region 13a with the conductive bumps 24 disposed thereon. The outer terminals 70, i.e., the top surfaces 40a of the electrode posts 40 and the solder balls 60, are exposed from the sealing portion 50.

The acceleration sensor chip 11 is attached to a substrate 12. The substrate 12 has an upper surface 12a and a lower surface 12b opposite to the upper surface 12a. When the substrate 12 is attached to the acceleration sensor chip 11, the upper surface 12a of the substrate 12 is separated from the bottom surface 14bb of the movable portion 14b other than the attaching surface attached to the acceleration sensor chip 11 by a distance D to secure a specific displacement of the movable structure 15. The movable structure 15 is sealed in a closed space surrounded by the substrate 12, the sensor control chip 20, and the sealing portion 50. The substrate 12 is formed of a proper material, preferably a glass substrate.

In the present invention, without a protection cover conventionally used for sealing an acceleration sensor chip and bonding wires, it is possible to form the acceleration sensor chip package 10 having a size same as that of the chip while retaining the outer terminals, thereby greatly reducing the outer side of the package, and improving design flexibility in an arrangement of the outer terminals. Accordingly, it is possible to provide the package with a higher function and higher value, i.e., the function of the sensor control chip.

An operation of the acceleration sensor chip package 10 will be explained next. A signal input from an external device is input to the sensor control chip 20 through the second wiring portions 17ab, the second electrode pads 18b, the conductive bumps 24, and the sensor control electrode pads 22. According to the signal, the sensor control chip 20 sends a control signal to the acceleration sensor chip 11 through the sensor control electrode pads 22, the conductive bumps 24, the second electrode pads 18b, and the second wiring portions 17ab for controlling the acceleration sensor chip 11.

In the embodiment, the sensor control electrode pads 22 of the sensor control chip 20 are directly connected to the second electrode pads 18b of the acceleration sensor chip 11 through the conductive bumps 24. Accordingly, it is possible to exchange a signal between the sensor control chip 20 and the acceleration sensor chip 11 at a high speed.

When acceleration is applied to the acceleration sensor chip package 10, the movable portion 14b is displaced.

Accordingly, the beam portion 14a supporting the movable portion 14b deforms by an amount proportional to the displacement of the movable portion 14b. The detection elements 19 disposed on the beam portion 14a detect the amount of the deformation as a change in resistance. The change in resistance is output to a detection circuit through the electrode pads 18 electrically connected to the detection elements 19 and the outer terminals 70, i.e., the electrode posts 40 and the solder balls 60. As a result, the acceleration applied to the acceleration sensor chip package 10 is measured quantitatively.

With reference to FIGS. 2(A) and 2(B) to 7(A)-7(C), a method of producing the acceleration sensor chip package 10 will be explained next. In the invention, it is characterized that the acceleration sensor chip package is produced with the process technology of Wafer Level Chip Size Package (W-CSP), in which re-wiring, forming the outer terminals, sealing, and cutting in pieces are performed at a wafer level. In the following explanation, although a plurality of the acceleration sensor chips packages is arranged in a grid pattern and produced all at once at the wafer level, two adjacent acceleration sensor chips (packages) are shown for the sake of explanation.

Figure 3A:
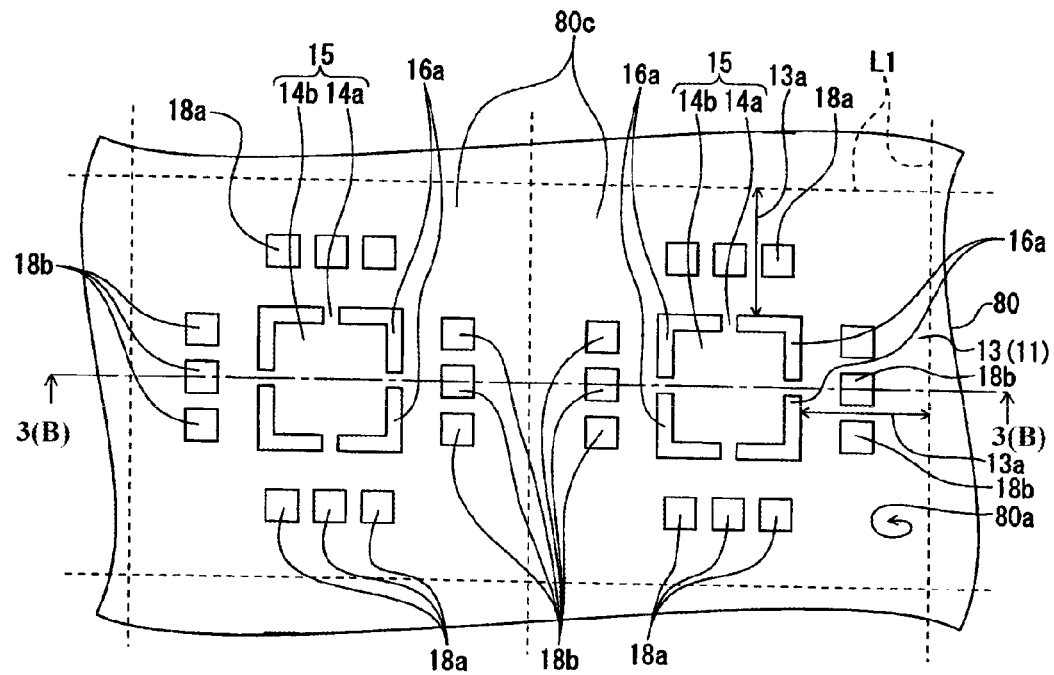
FIG. 3(A) is a schematic plan view showing the acceleration sensor chip package during the manufacturing process continued from FIG. 2(A)
Figure 3B:
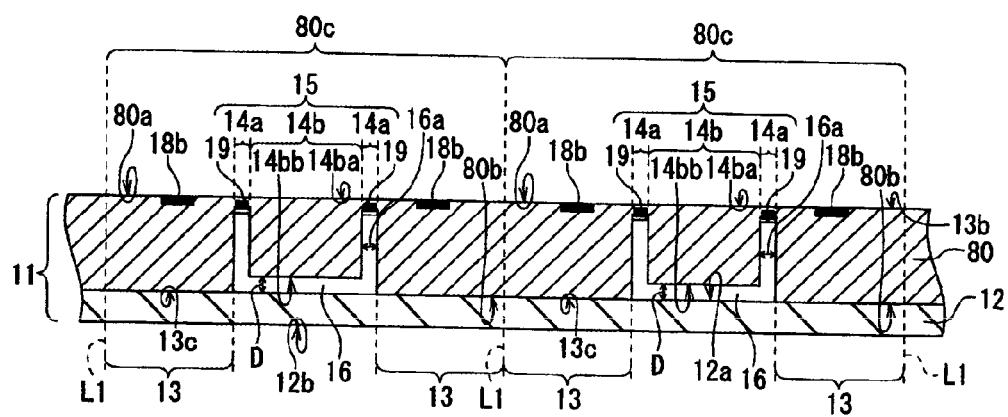
FIG. 3(B) is a sectional view taken along a projected line 3(B)-3(B) in FIG. 3(A)
Figure 4A:
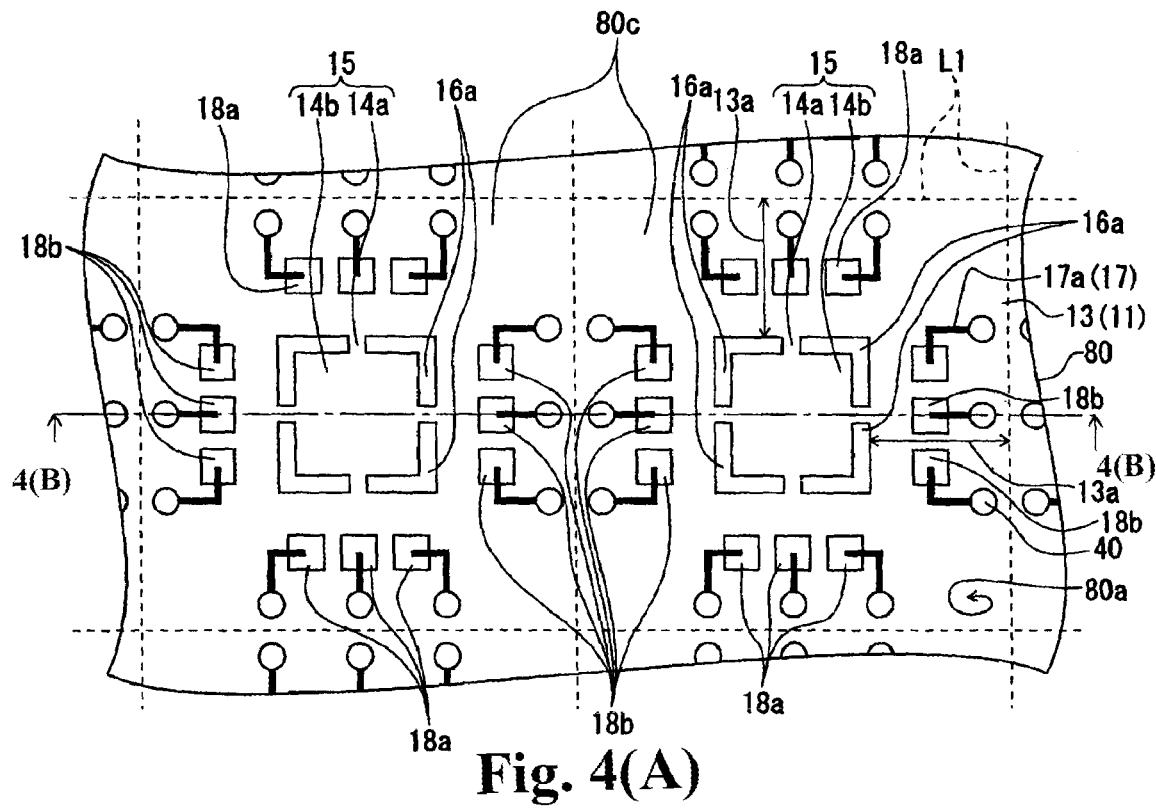
FIG. 4(A) is a schematic plan view showing the acceleration sensor chip package during the manufacturing process continued from FIG. 3(A)
Figure 4B:
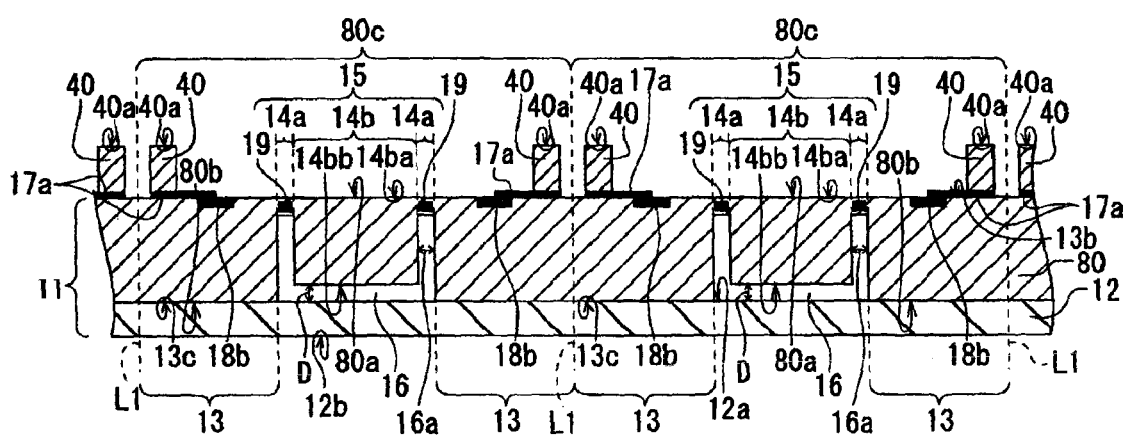
FIG. 4(B) is a sectional view taken along a projected line 4(B)-4(B) in FIG. 4(A)
Figure 5A:
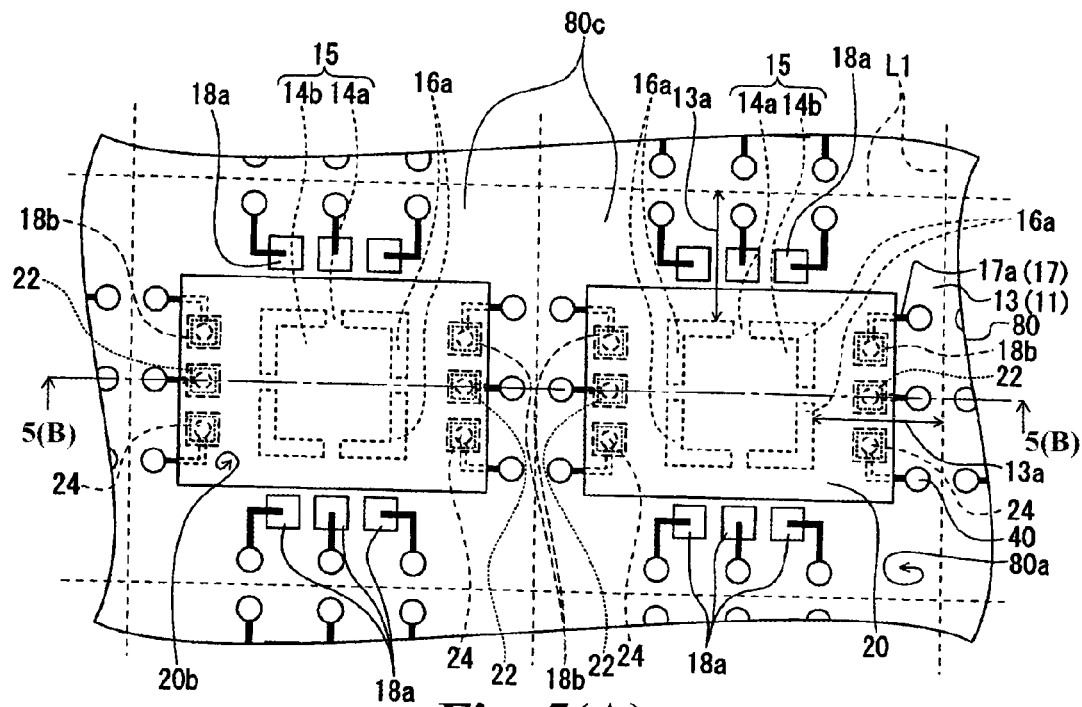
FIG. 5(A) is a schematic plan view showing the acceleration sensor chip package during the manufacturing process continued from FIG. 4(A)
Figure 5B:
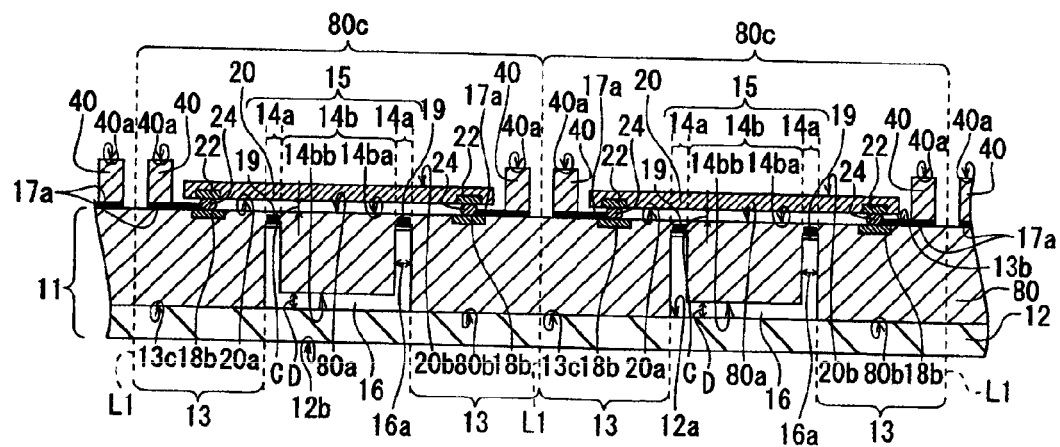
FIG. 5(B) is a sectional view taken along a projected line 5(B)-5(B) in FIG. 5(A)
Figure 6A:
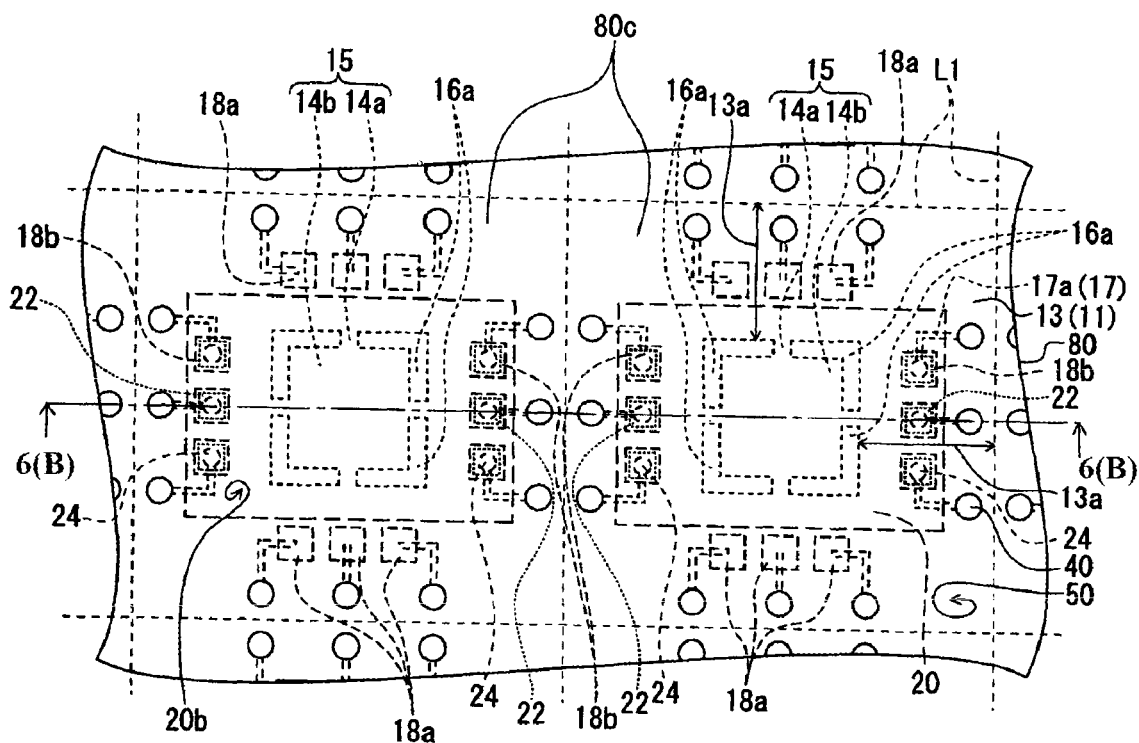
FIG. 6(A) is a schematic plan view showing the acceleration sensor chip package during the manufacturing process continued from FIG. 5(A)
Figure 6B:
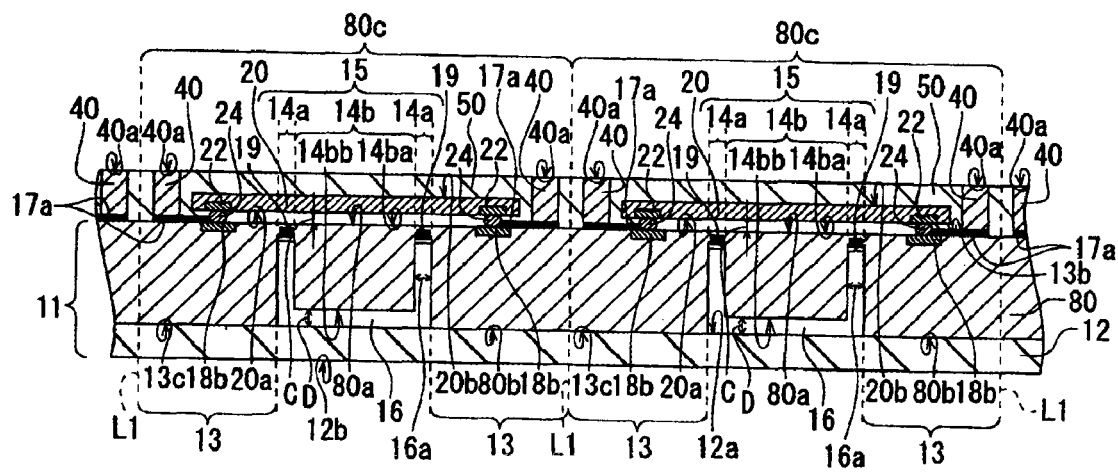
FIG. 6(B) is a sectional view taken along a projected line 6(B)-6(B) in FIG. 6(A)

FIG. 2(A) is a schematic plan view showing the acceleration sensor chip package during a manufacturing process, and FIG. 2(B) is a sectional view taken along a projected line 2(B)-2(B) in FIG. 2(A). FIG. 3(A) is a schematic plan view showing the acceleration sensor chip package during the manufacturing process continued from FIG. 2(A), and FIG. 3(B) is a sectional view taken along a projected line 3(B)-3(B) in FIG. 3(A). FIG. 4(A) is a schematic plan view showing the acceleration sensor chip package during the manufacturing process continued from FIG. 3(A), and FIG. 4(B) is a sectional view taken along a projected line 4(B)-4(B) in FIG. 4(A). FIG. 5(A) is a schematic plan view showing the acceleration sensor chip package during the manufacturing process continued from FIG. 4(A), and FIG. 5(B) is a sectional view taken along a projected line 5(B)-5(B) in FIG. 5(A). FIG. 6(A) is a schematic plan view showing the acceleration sensor chip package during the manufacturing process continued from FIG. 5(A), and FIG. 6(B) is a sectional view taken along a projected line 6(B)-6(B) in FIG. 6(A). FIG. 7(A) is a schematic plan view showing the acceleration sensor chip package during the manufacturing process continued from FIG. 6(A), FIG. 7(B) is a sectional view taken along a projected line 7(B)-7(B) in FIG. 7(A), and FIG. 7(C) is a schematic sectional view showing the acceleration sensor chip package upon completion of the manufacturing process.

As shown in FIGS. 2(A) and 2(B), first, a silicon wafer 80 is prepared. The silicon wafer 80 has a first surface 80a and a second surface 80b opposite to the first surface 80a. A plurality of chip regions 80c is defined on the silicon wafer 80 in advance. The chip regions 80c eventually become the acceleration sensor chip packages 10 through a process of cutting in pieces (described later). Hidden lines L1 defining the chip regions 80c are scribe lines (dicing lines).

In the next step, as shown in FIGS. 3(A) and 3(B), the silicon wafer 80 is processed with a known photolithography process and a known etching process to integrally form the movable structures 15. That is, the movable structures 15 having an essential function of the acceleration sensor are formed in the chip regions 80c. The movable structures 15 thus formed in the silicon wafer are also called an intermediate movable structure.

As described above, the movable structure 15 includes the movable portion 14b and the beam portion 14a supporting the movable portion 14b. The bottom surface 14bb of the movable portion 14b is processed with a known photolithography process and a known etching process to form a proper shape (bottom shape), so that the beam portion 14a has an appropriate thickness, and the distance D is formed to secure a specific displacement of the movable structure 15 of the acceleration sensor chip 11. Specific constituents of the acceleration sensor chip 11 including the intermediate movable structure 15 are formed with a known process, and detailed explanations thereof are omitted.

The detection elements 19, i.e., the piezo-resistance elements 19 in the embodiment, are formed at specific positions of the beam portion 14a for detecting acceleration. Wirings (not shown) formed of aluminum are provided with a known process such that one end portions thereof are connected to the piezo-resistance elements 19. The other end portions of the wirings extend to outer areas outside the intermediate movable structure 15, i.e., appropriate positions on the frame portion 13 (described later), in the chip region 80c. The wirings are covered with an insulating layer. The electrode pads 18 exposed from the surface of the frame portion 13 are electrically connected to the other end portions of the wirings (not shown). The electrode pads 18 may be formed such that parts of the wirings are exposed from the insulating layer formed on the upper surface of the frame portion 13 of the acceleration sensor chip 11.

As shown in FIG. 3(B), the substrate 12 is attached to a remaining portion of the second surface 80b of the silicon wafer 80, so that a plurality of the opening portions 16 (the gaps 16a) arranged in a matrix pattern is covered. The remaining portion of the second surface 80b is an area between the frame portions 13 and the adjacent chip regions 80c. The substrate 12 is attached with an adhesive through a known method.

In the next step, as shown in FIGS. 4(A) and 4(B), the re-wiring layer 17 is formed on the frame portions 13 with a method similar to a manufacturing process of a re-wiring layer in the manufacturing process of so-called W-CSP. The re-wiring layer 17 includes a plurality of the wiring portions 17a. The re-wiring layer 17 is preferably formed of copper (Cu) or an alloy containing copper.

Specifically, first, a metal layer is formed on the frame portions 13. The metal layer is formed in a wiring pattern with known photolithography technology. The wiring portions 17a extend in the chip regions 80c, so that the end portions of the wiring portions 17a are electrically connected to the electrode pads 18. Then, the electrode posts 40 are formed on the re-wiring layer 17. In this process, after a conductive material such as copper is plated with a resist layer patterned with a known photolithography as a mask, the resist layer is removed. In the photolithography process, the resist layer is formed of a dry-developing resist, so that a dry developing process is performed. In the embodiment, the electrode posts 40 have a column shape having a circular section taken perpendicular to an extending direction (upper-to-lower direction in FIG. 4(B)).

In the next step, as shown in FIGS. 5(A) and 5(B), the sensor control chip 20 is mounted on the acceleration sensor chip 10. Specifically, the conductive bumps 24 are electrically connected to the second electrode pads 18b of the acceleration sensor chip 10. Then, the sensor control electrode pads 22 of the sensor control chip 20 are positioned to face the conductive bumps 24. The conductive bumps 24 are heated to melt, so that the sensor control chip 20 is mounted on the acceleration sensor chip 10. That is, the conductive bumps 24 are electrically connected to the second electrode pads 18b.

When the sensor control chip 20 is mounted on the acceleration sensor chip 10, the sensor control chip 20 is separated from the movable structures 15. That is, the sensor control chip 20 seals the movable structures 15 from above together with the sealing portion (described later).

In the next step, as shown in FIGS. 6(A) and 6(B), the sealing portion 50 is formed using, for example, a liquid sealing resin such as an epoxy-type mold resin and a liquid sealing material. The sealing process is performed with a known process such as a transfer molding method and a printing method.

Before the sealing process, the space is formed between the sensor control chip 20 and the acceleration sensor chip 10, and the movable structures 15 are not sealed. Accordingly, in the sealing process, it is necessary to prevent the sealing resin from flowing into the opening portions 16 to block the movable structures 15. Accordingly, it is preferred that the sealing resin has a low flow rate, so that only a desired area is sealed. Alternatively, it is possible to increase a size of filler in the sealing resin.

The sealing portion 50 may be formed to cover the top surfaces 40a of the electrode posts 40, and then the top surfaces 40a of the electrode posts 40 are ground to expose from the sealing portion 50. The sealing portion 50 may be formed with a film forming method. In this case, during the sealing process, it is possible to reduce a load applied to the electrode posts 40. It is also possible to expose the top surfaces 40a of the electrode posts 40 from the sealing portion 50 without the grinding process.

The top surfaces 40a of the electrode posts 40 may be treated with an appropriate process. For example, when the electrode posts 40 are formed of copper, a thin nickel (Ni) layer may be formed on the top surfaces 40a of the electrode posts 40 as a barrier layer.

In the next step, as shown in FIGS. 7(A) and 7(B), the solder balls 60 are disposed on the top surfaces 40a of the electrode posts 40. In the embodiment, the outer terminals 70 are formed of the electrode posts 40 and the solder balls 60. Alternatively, the outer terminals 70 may be formed of a planer structure such as a land in which parts of the wiring portions 17a are exposed from the sealing portion 50 without using the electrode posts 40. After this step, the acceleration sensor chip packages 10 are completely packaged at the wafer level.

In the next step, a dicing process is performed on the areas between the adjacent chip regions 80c shown in FIGS. 7(A) and 7(B) along the scribe lines L1 with a known dicing machine. Accordingly, as shown in FIG. 7(C), it is possible to produce a plurality of the acceleration sensor chip packages 10 having an identical structure from one single wafer.

In the method of producing the acceleration sensor chip packages 10 according to the embodiment of the present invention, the electrode pads 18 of the acceleration sensor chip 11 are re-wired with the W-CSP process, and the outer terminals 70 are formed at the appropriate positions. It is also possible to efficiently produce the acceleration sensor chip packages 10 having a shape same as that of the acceleration sensor chip 11 in a plan view. It is unnecessary to provide an additional production line, and it is possible to produce the acceleration sensor chip packages 10 with cost substantially same as that of producing a conventional semiconductor device.

Second Embodiment

A second embodiment of the present invention will be explained with reference to FIGS. 8(A) and 8(B). According to the second embodiment, in the acceleration sensor chip package of the first embodiment, the gap between the acceleration sensor chip and the sensor control chip mounted on the acceleration sensor chip with the flip-chip connection is sealed with a resin. Except the mounting structure of the sensor control chip on the acceleration sensor chip, the configuration of the second embodiment is similar to that of the first embodiment. Accordingly, the same reference numerals denote components same as those in the first embodiment, and explanations thereof are omitted.

Figures 8A, 8B:
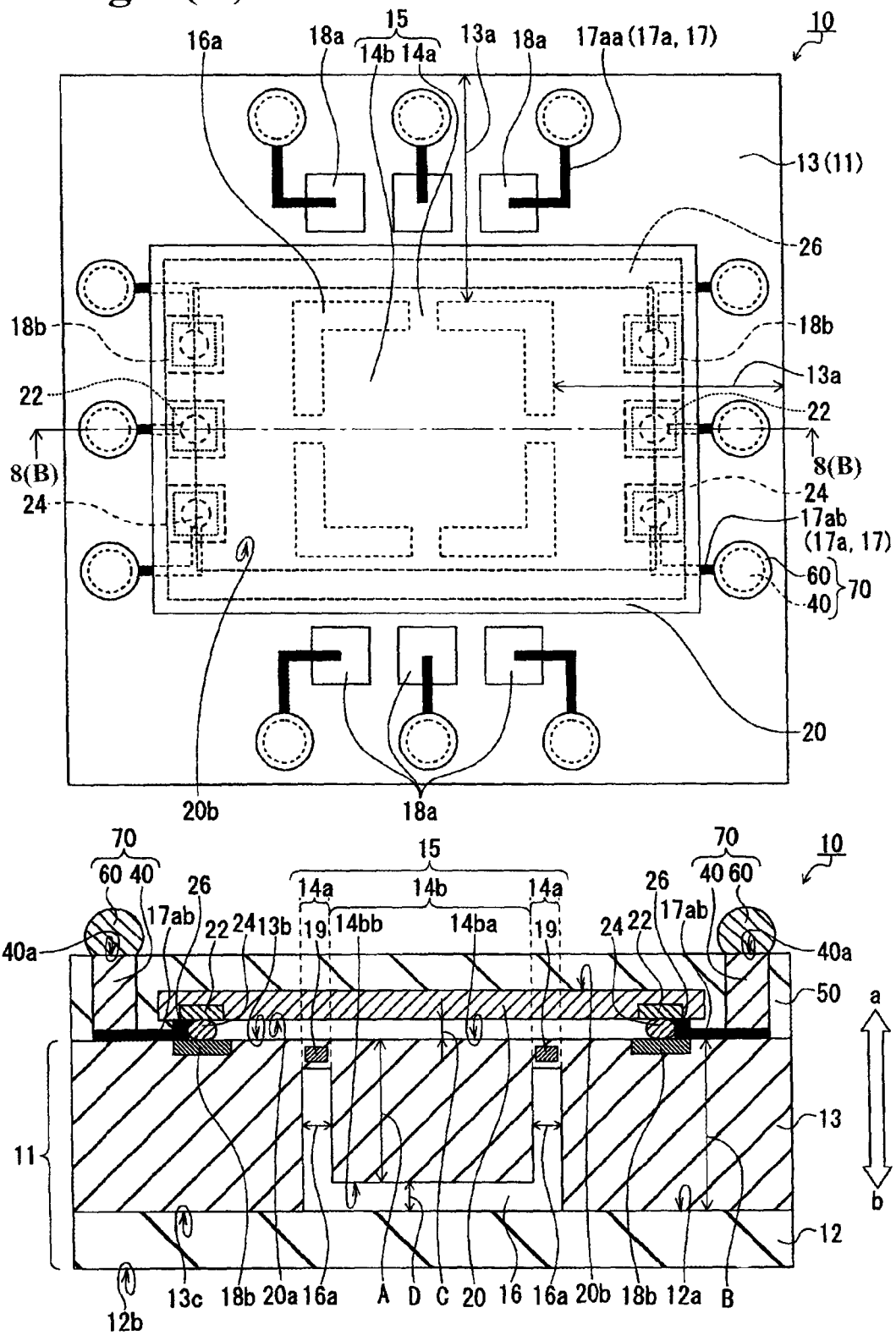
FIG. 8(A) is a schematic plan view showing an acceleration sensor chip package for explaining constituents thereof according to a second embodiment of the present invention.
FIG. 8(B) is a sectional view taken along a projected line 8(B)-8(B) in FIG. 8(A)

FIG. 8(A) is a schematic plan view showing the acceleration sensor chip package viewed from above for explaining constituents thereof according to the second embodiment of the present invention. For the sake of the explanation, the sealing portion situated on the top surface is omitted. FIG. 8(B) is a sectional view taken along a projected line 8(B)-8(B) in FIG. 8(A).

As shown in FIGS. 8(A) and 8(B), the acceleration sensor chip package 10 is provided with the acceleration sensor chip 11. The acceleration sensor chip 11 is provided with the frame portion 13. The acceleration sensor chip 11 is also provided with the opening portion 16. The acceleration sensor chip 11 is also provided with the movable structure 15 having the beam portion 14a and the movable portion 14b. The beam portion 14a extends from the frame portion 13 into the opening portion 16. The movable portion 14b is disposed at a distal end of the beam portion 14a protruding into the opening portion 16, and hangs downwardly with the beam portion 14a and is disposed inside the opening portion 16. The frame portion 13 is integrated with the beam portion 14a. The movable portion 14b is separated from the frame portion 13 and from the side edges of the beam portion 14a except connected portions between the frame portion 13 and the movable portion 14b with the gaps 16a.

In the embodiment, the beam portion 14a is provided with the detection elements 19 or the piezo-resistance elements. Each of the detection elements 19 is connected to a wiring (not shown) for outputting a signal to outside or inputting a signal to the detection elements 19.

The sensor control chip 20 is mounted on the acceleration sensor chip 11. The sensor control chip 20 has the first surface 20a and the second surface 20b opposite to the first surface 20a. A plurality of the sensor control electrode pads 22 is disposed on the first surface 20a in an exposed state. In the embodiment, the sensor control electrode pads 22 are arranged along a circumference of the sensor control chip 20. The sensor control chip 20 is mounted on the acceleration sensor chip 11 such that the first surface 20a faces the upper surface 14ba of the movable portion 14b. At this time, the second electrode pads 18b arranged along the opposing sides of the acceleration sensor chip 11 are individually connected to the sensor control electrode pads 22 through conductive bumps 24. That is, the sensor control chip 20 is flip-chip connected on the acceleration sensor chip 11.

The gap between the acceleration sensor chip 11 and the sensor control chip 20 mounted on the acceleration sensor chip 11 with the flip-chip connection is filled with a resin ring portion 26. That is, the resin ring portion 26 is disposed in a closed shape or a ring shape. The resin ring portion 26 surrounds the opening portion 16 (gaps 16a), and is separated from the edge of the frame portion 13 defining the opening portion 16. The resin ring portion 26 is also disposed on the frame portion 13 and contacts with a surface 20a of the sensor control chip 20. That is, the resin ring portion 26 seals the opening portion 16 from above together with the frame portion 13 and the sensor control chip 20.

The resin ring portion 26 fills gaps between the conductive bumps 24 arranged in parallel at the edge of the opening portion 16. The resin ring portion 26 is preferably formed of a resin such as an epoxy resin having high thixotropy and specific elasticity in a cured state.

The sensor control chip 20 is separated from the movable portion 14b. That is, the sensor control chip 20 seals the movable structure 15 or the beam portion 14a and the movable portion 14b from the upper side of the opening portion 16 or a side of the upper surface 14ba of the movable portion 14b. The sensor control chip 20 may have an arbitrary thickness. The sensor control chip 20 has a function of sealing and protecting the movable structure 15 and restricting the movable portion 14a to move from a bottom surface 14bb to the upper surface 14ba thereof, in addition to the function as the chip described above.

The conductive bumps 24 has a height equal to or grater than a height C between the sensor control chip 20 and the upper surface 14ba of the movable portion 14b shown in FIG. 8(B), so that the movement of the movable portion 14b in the allow direction is not restricted to measure target acceleration.

The re-wiring layer 17 is disposed on the upper surface 13b of the frame portion 13. The re-wiring layer 17 includes a plurality of wiring portions 17a. One end of the wiring portion 17a is electrically connected to the electrode pad 18, i.e., one of the first electrode pad 18a and the second electrode pad 18b. The wiring portions 17a connected to the first electrode pads 18a may be called first wiring portions 17aa, and the wiring portions 17a connected to the second electrode pads 18b may be called second wiring portions 17ab. The other end of the wiring portion 17a, i.e., the upper surface 13b of the frame portion 13, is electrically connected to the outer terminal 70.

Accordingly, the outer terminal 70 is electrically connected to the piezo-resistance element 19 through the re-wiring layer 17, the first electrode pad 18a connected to the re-wiring layer 17, and a wiring (not shown) connected to the first electrode pad 18a. Further, the outer terminal 70 is electrically connected to the sensor control chip 20 through the re-wiring layer 17, the second electrode pad 18a connected to the re-wiring layer 17, the conductive bump 24, and the sensor control electrode pad 22 connected to the conductive bump 24.

The outer terminals 70 function as a terminal for inputting and outputting a signal from an mounting substrate and an external device for the operation of the acceleration sensor chip, a signal applied to a power source, or a signal from the acceleration sensor chip package 10.

The sealing portion 50 is disposed on the acceleration sensor chip 11 for sealing the sensor control chip 20 and the re-wiring layer 17, such that the outer terminals 70 are exposed. The sealing portion 50 contacts with the resin ring portion 26 and extends outside the same. The outer terminals 70, i.e., the top surfaces 40a of the electrode posts 40 and the solder balls 60, are exposed from the sealing portion 50. In the embodiment, the outer terminal 70 is formed of an electrode post 40 electrically connected to the other end of the wiring portion 17a and a solder ball 60 electrically connected to a top surface 40a of the electrode post 40.

The acceleration sensor chip 11 is attached to the substrate 12. The upper surface 12a of the substrate 12 is separated from the bottom surface 14bb of the movable portion 14b other than the attaching surface attached to the acceleration sensor chip 11 by a distance D to secure a specific displacement of the movable structure 15. The movable structure 15 is sealed in a closed space surrounded by the substrate 12, the sensor control chip 20, and the sealing portion 50. With the configuration described above, it is possible to effectively seal the movable structure with the resin ring portion 26, in addition to the advantages of the acceleration sensor chip package 10 of the first embodiment.

Figure 9A:
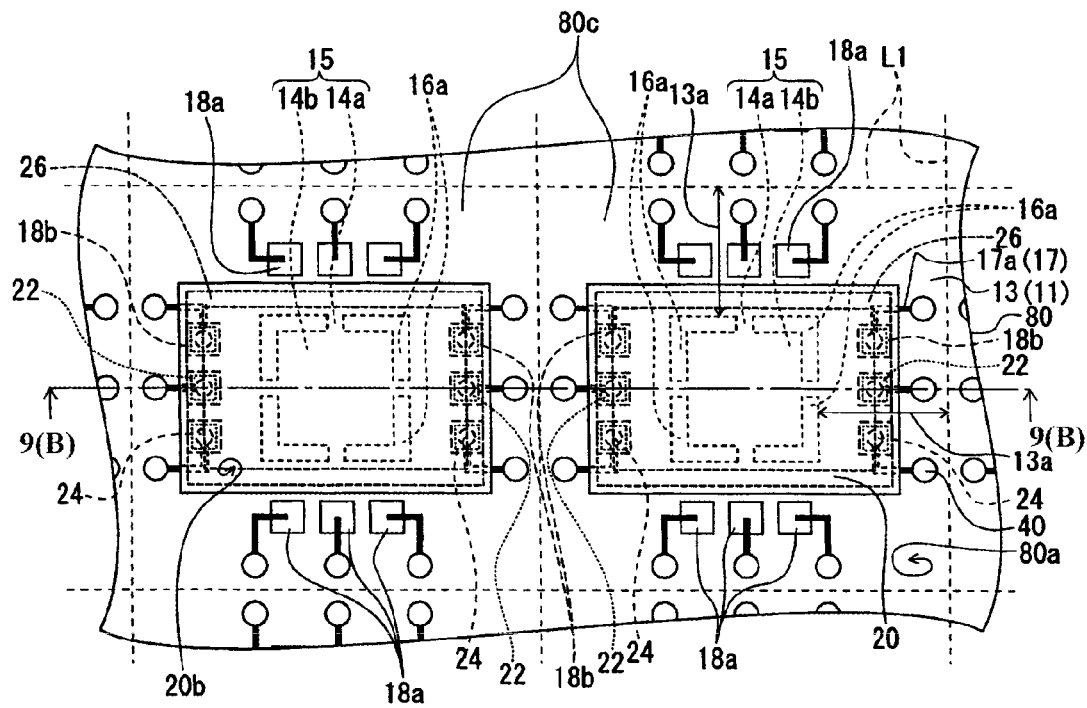
FIG. 9(A) is a schematic plan view of the acceleration sensor chip package during a manufacturing process.
Figure 9B:
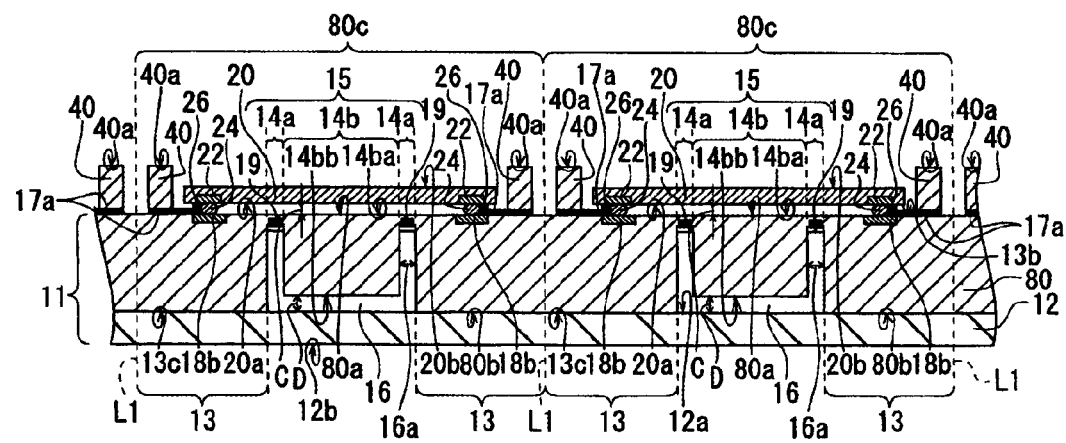
FIG. 9(B) is a sectional view taken along a projected line 9(B)-9(B) in FIG. 9(A)

With reference to FIGS. 9(A) and 9(B), a method of producing the acceleration sensor chip package 10 of the second embodiment will be explained next. Except for a step of mounting the sensor control chip on the acceleration sensor chip, the method of the second embodiment is substantially same as that of the first embodiment. In the following description, only the step of mounting will be explained in detail, and other steps same as those in the first embodiment will be briefly explained.

First, the silicon wafer 80 is prepared. The silicon wafer 80 has the first surface 80a and the second surface 80b opposite to the first surface 80a. A plurality of the chip regions 80c is defined on the silicon wafer 80 in advance. The chip regions 80c eventually become the acceleration sensor chip packages 10 through a process of cutting in pieces (described later).

In the next step, the movable structures 15 are integrally formed with a known photolithography process and a known etching process. That is, the movable structures 15 having an essential function of the acceleration sensor are formed in the chip regions 80c. The bottom surface 14bb of the movable portion 14b is processed with a known photolithography process and a known etching process to form a proper shape (bottom shape), so that the beam portion 14a has an appropriate thickness, and the distance D is formed to secure a specific displacement of the movable structure 15 of the acceleration sensor chip 11.

The detection elements 19, i.e., the piezo-resistance elements 19 in the embodiment, are formed at specific positions of the beam portion 14a for detecting acceleration. The wirings (not shown) formed of aluminum are provided with a known process such that one end portions thereof are connected to the piezo-resistance elements 19. The other end portions of the wirings are disposed in the chip regions 80c, and extend to outer areas outside the intermediate movable structure 15, i.e., appropriate positions on the frame portion 13 (described later), in the chip region 80c. The wirings are covered with the insulating layer. The electrode pads 18 exposed from the surface of the frame portion 13 are electrically connected to the other end portions of the wirings (not shown). The electrode pads 18 may be formed such that parts of the wirings are exposed from the insulating layer formed on the upper surface of the frame portion 13 of the acceleration sensor chip 11.

In the next step, the substrate 12 is attached to a remaining portion of the second surface 80b of the silicon wafer 80, so that a plurality of the opening portions 16 (the gaps 16a) arranged in a matrix pattern is covered. The remaining portion of the second surface 80b is an area between the frame portions 13 and the adjacent chip regions 80c. The substrate 12 is attached with an adhesive through a known method.

In the next step, the re-wiring layer 17 is formed on the frame portions 13 with a method similar to a manufacturing process of a re-wiring layer in the manufacturing process of so-called W-CSP. The re-wiring layer 17 includes a plurality of the wiring portions 17a. Specifically, first, a metal layer is formed on the frame portions 13. The metal layer is formed in a wiring pattern with known photolithography technology. The wiring portions 17a extend in the outer region 13a, so that the end portions of the wiring portions 17a are electrically connected to the electrode pads 18. Then, the electrode posts 40 are formed on the re-wiring layer 17. In this process, after a conductive material such as copper is plated with a resist layer patterned with a known photolithography as a mask, the resist layer is removed.

In the next step, the sensor control chip 20 is mounted on the acceleration sensor chip 10. Specifically, the conductive bumps 24 are electrically connected to the second electrode pads 18b of the acceleration sensor chip 10. Then, the sensor control electrode pads 22 of the sensor control chip 20 are positioned to face the conductive bumps 24. The conductive bumps 24 are heated to melt, so that the sensor control chip 20 is mounted on the acceleration sensor chip 10.

In the next step, in each of the chip regions 80c arranged in a matrix pattern, the gap between the sensor control chip 20 and the acceleration sensor chip 10 is filled with the resin ring portion 26. That is, the resin material is formed in a ring shape or a closed shape to form the resin ring portion 26 surrounding the opening portion 16 or the gaps 16a, so that the resin ring portion 26 is separated from the edge of the frame portion 13 defining the opening portion 16 and closely contacts with the first surface 20a of the sensor control chip 20.

More specifically, as shown in FIGS. 9(A) and 9(B), the resin material with certain elasticity in a cured state is poured into the gap between the sensor control chip 20 and the acceleration sensor chip 10 with a known dispenser method. Then, the resin material is cured with an appropriate method under an appropriate condition. Accordingly, the resin ring portion 26 is cured, and seals the opening portion 16 from above together with the frame portion 13 and the sensor control chip 20.

In the next step, the sealing portion 50 is formed using, for example, a liquid sealing resin such as an epoxy-type mold resin and a liquid sealing material. The sealing process is performed with a known process such as a transfer molding method, and a printing method. Then, the solder balls 60 are disposed on the top surfaces 40a of the electrode posts 40. After this step, the acceleration sensor chip packages 10 are completely packaged at the wafer level.

In the next step, a dicing process is performed on the areas between the adjacent chip regions 80c shown in FIGS. 7(A) and 7(B) along the scribe lines L1 with a known dicing machine. Accordingly, it is possible to produce a plurality of the acceleration sensor chip packages 10 having an identical structure from one single wafer.

In the method of producing the acceleration sensor chip packages 10 according to the second embodiment of the present invention, it is possible to efficiently seal the movable structure with the resin ring portion, in addition to the advantages of the first embodiment. It is also possible to use a wide variety of resin materials for the sealing resin, thereby making the sealing process easy.

Third Embodiment

A third embodiment of the present invention will be explained with reference to FIGS. 10(A), 10(B), 11(A), and 11(B). According to the third embodiment, in the acceleration sensor chip packages of the first and second embodiments, the upper surface side is sealed with the substrate and the lower surface side is sealed with the sensor control chip.

Figure 10A:
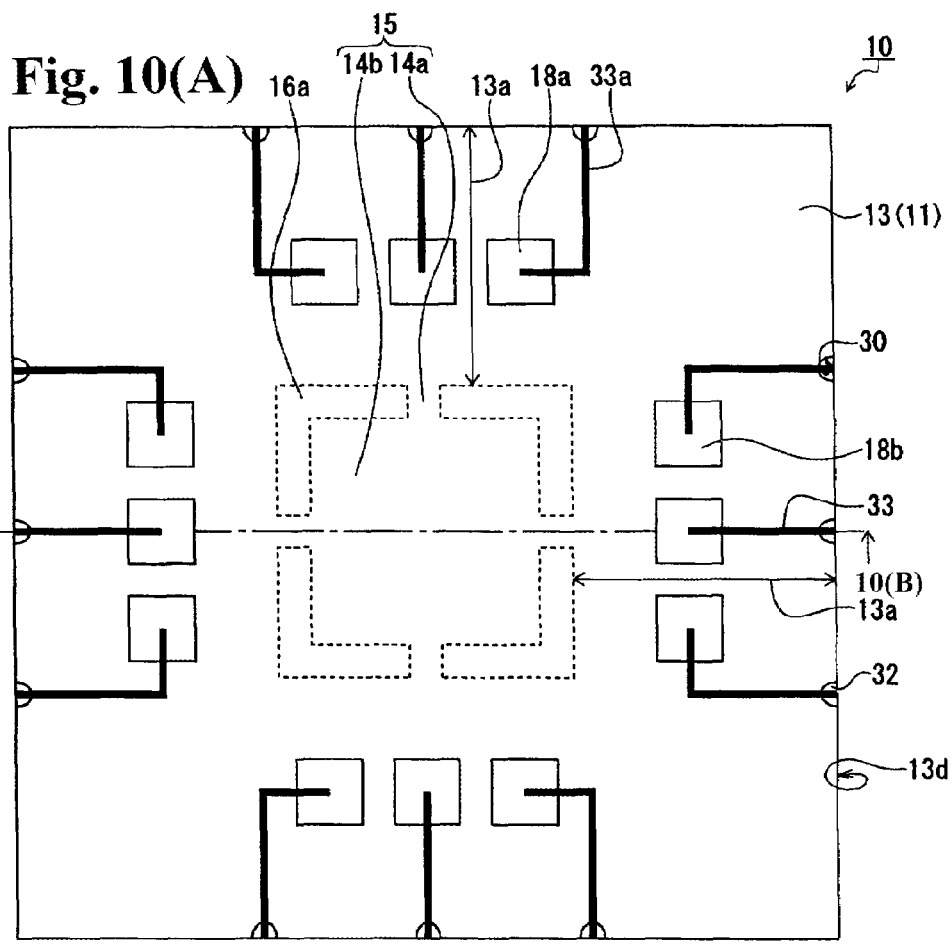
FIG. 10(A) is a schematic plan view showing an acceleration sensor chip package viewed from above for explaining constituents thereof according to a third embodiment of the present invention.
Figure 10B:
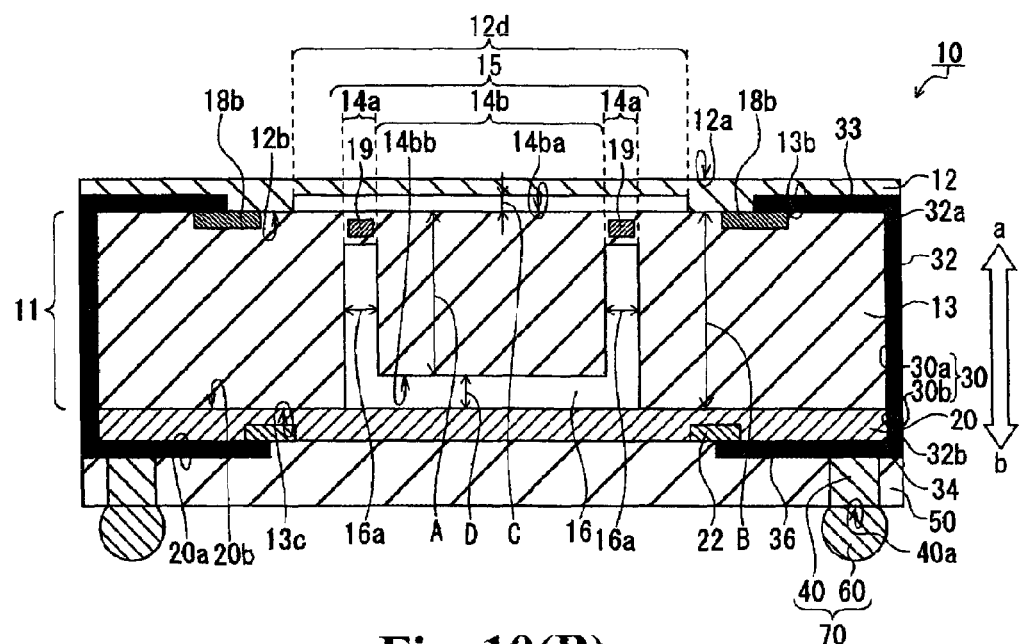
FIG. 10(B) is a sectional view taken along a projected line 10(B)-10(B) in FIG. 10(A)
Figure 11A:
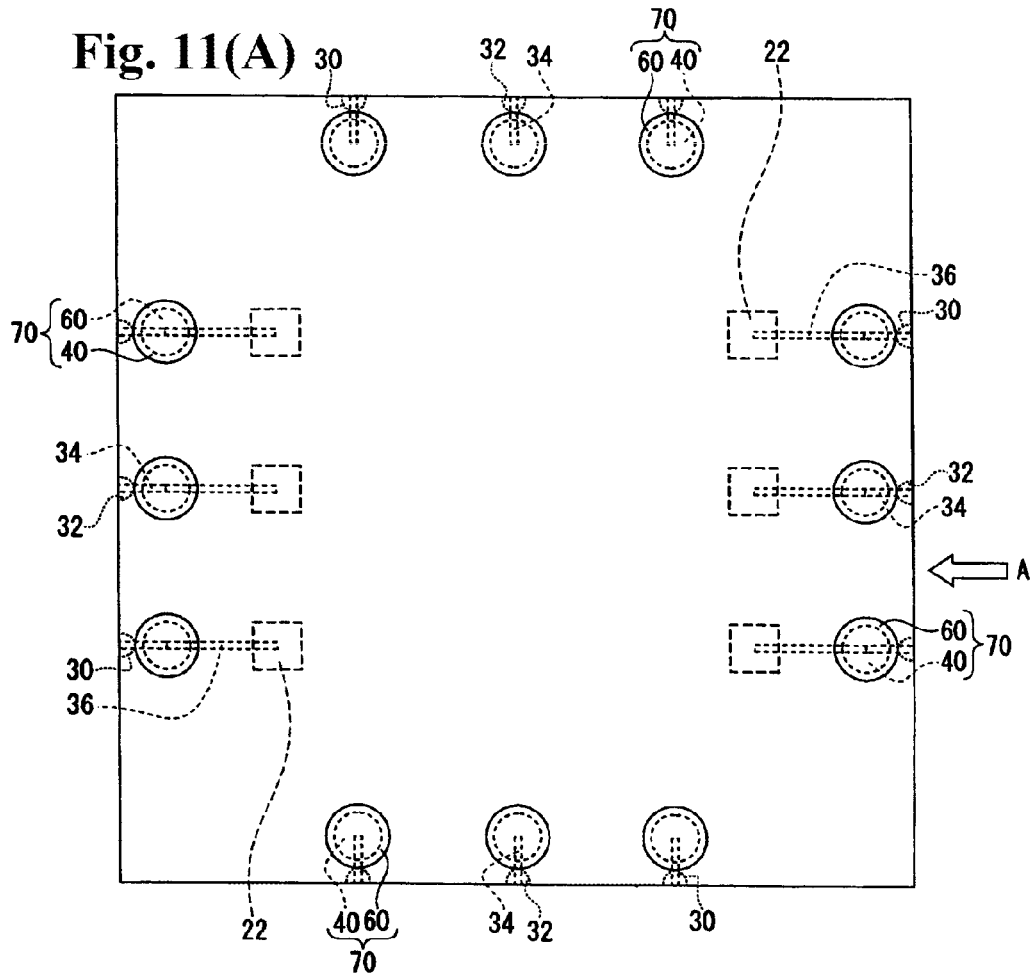
FIG. 11(A) is a schematic bottom view of the acceleration sensor chip package viewed from below for explaining constituents thereof.
Figure 11B:
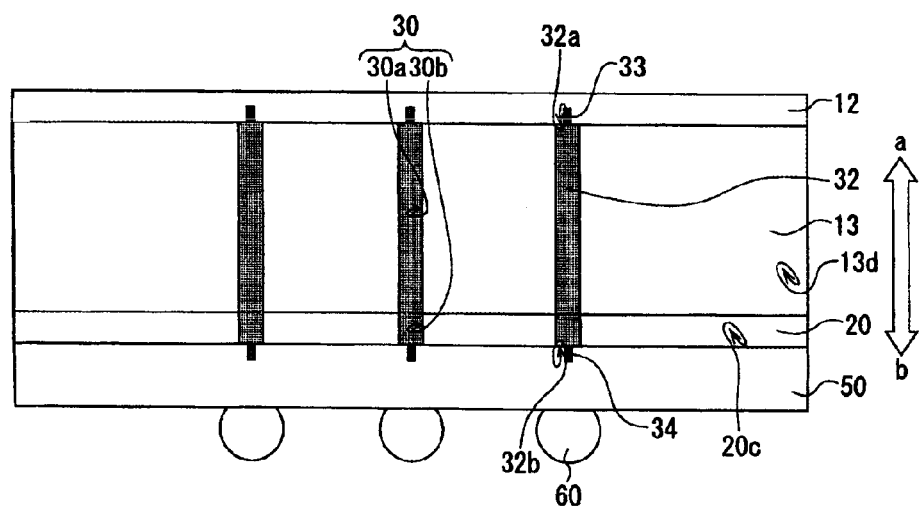
FIG. 11(B) is a side view thereof.

FIG. 10(A) is a schematic plan view showing the acceleration sensor chip package viewed from above for explaining constituents thereof according to the second embodiment of the present invention. For the sake of the explanation, the substrate (described later) situated on the top surface is omitted. FIG. 10(B) is a sectional view taken along a projected line 10(B)-10(B) in FIG. 10(A). FIG. 11(A) is a schematic bottom view of the acceleration sensor chip package viewed from below for explaining constituents thereof, and FIG. 11(B) is a side view thereof.

As shown in FIGS. 10(A) and 10(B), the acceleration sensor chip package 10 is provided with the acceleration sensor chip 11. The acceleration sensor chip 11 is provided with the frame portion 13. The frame portion 13 is a rectangular frame defining an outer shape of the acceleration sensor chip 11. The acceleration sensor chip 11 is also provided with the opening portion 16. The opening portion 16 is a through hole surrounded by the frame portion 13. The acceleration sensor chip 11 is also provided with the movable structure 15 having the beam portion 14a and the movable (weight) portion 14b. The beam portion 14a extends from the frame portion 13 into the opening portion 16. The beam portion 14a has a small thickness and a small width, and functions as a flexible portion deforming when the movable portion 14b moves.

The movable portion 14b is disposed at a distal end of the beam portion 14a protruding into the opening portion 16, and hangs downwardly with the beam portion 14a and is disposed inside the opening portion 16. The upper surface 14ba of the movable portion 14b is situated at a height substantially same as that of the beam portion 14a and the frame portion 13. The movable portion 14b has a thickness A smaller than a thickness B of the frame portion 13. That is, the movable portion 14b is supported inside the opening portion 16 with the beam portion 14a. The movable structure 15 may be disposed in, for example, a silicon wafer. The frame portion 13 is integrated with the beam portion 14a, so that the frame portion 13 supports the beam portion 14a at the connected portions thereof, and the beam portion 14a supports the movable portion 14b.

It is necessary to arrange the movable portion 14b to be movable in an arrow direction a or an arrow direction b shown in FIG. 10(B) for measuring acceleration. Accordingly, the movable portion 14b is separated from the frame portion 13 with the gaps 16a and from side edges of the beam portion 14a except connected portions between the frame portion 13 and the movable portion 14b, so that the movable portion 14b does not directly contact with the frame portion 13, and the beam portion 14a does not interfere the movement of the movable portion 14b.

In the embodiment, the movable structure 15 is formed of the beam portion 14a having the four components and the movable portion 14b supported in four directions with the four components of the beam portion 14a. According to the present invention, the configuration of the acceleration sensor chip package is not limited to the embodiment, and may be applicable to configurations of any movable structures disposed in conventional acceleration sensors. For example, the configuration of the acceleration sensor chip package is applicable to a cantilever configuration in which the movable portion 14b is supported in one direction.

The acceleration sensor chip package 10 has a size same as an outer size of the acceleration sensor chip 11 in a plan view viewed from an upper surface thereof (or a lower surface). The acceleration sensor chip package 10 has a rectangular column shape, and not limited thereto. As shown in FIGS. 10(A) and 10(B), the beam portion 14a is formed of the four components protruding into the opening portion 16 from the center of each side of the upper surface 13b of the frame portion 13. The movable portion 14b is supported at distal end portions of the four components of the beam portion 14a. In the embodiment, the movable portion 14b has a cubical shape. That is, the beam portion 14a has a rectangular shape in a plan view, and the beam portion 14a is connected to center portions of four sides of a square, i.e., an upper surface of the cubic. Alternatively, the movable portion 14b may have another shape according to estimated acceleration and measurement conditions.

In the embodiment, the beam portion 14a is provided with the detection elements 19 or piezo-resistance elements. An appropriate number of the detection elements 19 are disposed at appropriate positions according to a design for measuring acceleration as a measurement target. The detection elements 19 measure displacement (acceleration) of the movable structure 15, and are not limited to the piezo-resistance elements. For example, a detection element used in an arbitrary acceleration sensor such as an electrostatic type may be applicable.

Each of the detection elements 19 is connected to a wiring (not shown) for outputting a signal to outside or inputting a signal to the detection elements 19. The wiring may be formed of a known configuration and a known material such as aluminum (Al). A plurality of electrode pads 18 is disposed on the outer region 13a of the frame portion 13 outside the opening portion 16 in an exposed state from the frame portion 13.

A plurality of the electrode pads 18 is disposed in the outer region 13a of the frame portion 13 outside the opening portion 16 in an exposed state from the frame portion 13. Each of the electrode pads 18 includes a first electrode pad 18a and a second electrode pad 18b arranged along sides defining the outer contour of the frame portion 13. More specifically, in the embodiment, the first electrode pads 18a are arranged along two opposing sides, and the second electrode pads 18b are arranged along other two opposing sides. The first electrode pad 18a is electrically connected to the piezo-resistance element 19 on the beam portion 14a through a wiring (not shown). The second electrode pad 18b may be or may not be electrically connected to the piezo-resistance element 19 on the beam portion 14a through a wiring (not shown).

As shown in FIG. 11(B), the acceleration sensor chip 11 is provided with a plurality of first groove portions 30a in side surfaces 13d of the frame portion 13. A plurality of the first groove portions 30a extends from the upper surface 13b to the lower surface 13c of the frame portion 13 along the edges of the frame portion 13 as a linear structure engraved in the side surfaces 13d. In the embodiment, three linear first groove portions 30a having a same width are disposed with an equal distance therebetween. A shape, width, and number of the first groove portions 30a are not limited to the embodiment, and may be arbitrarily selected.

The sensor control chip 20 is attached to the bottom surface of the acceleration sensor chip 11, i.e., the lower surface 13c of the frame portion 13. The sensor control chip 20 may have a shape and an outer size for sealing the opening portion 16. The sensor control chip 20 functions as a semiconductor chip performing an electrical operation to control an operation of the acceleration sensor chip. The sensor control chip 20 is formed of a chip having one or more than two functions properly selected from amplifier function, angle calibration function, AD conversion function, DA conversion function, and memory function.

The sensor control chip 20 has the first surface 20a and the second surface 20b opposite to the first surface 20a. A plurality of the sensor control electrode pads 22 is disposed on the first surface 20a in an exposed state. In the embodiment, the sensor control electrode pads 22 are arranged along a circumference of the sensor control chip 20.

The sensor control chip 20 is provided with a plurality of second groove portions 30b extending from the first surface 20a to the second surface 20b along the edges of the sensor control chip 20 as a linear structure engraved in side surfaces 20c of the sensor control chip 20. In the embodiment, three linear second groove portions 30b having a same width are disposed with an equal distance therebetween. A shape, width, and number of the second groove portions 30b are not limited to the embodiment, and may be arbitrarily selected.

The sensor control chip 20 is mounted on the acceleration sensor chip 11 such that the first surface 20a faces the bottom surface 14bb of the movable portion 14b. That is, the second surface 20b is attached to the lower surface 13c of the frame portion 13 opposite to the upper surface 13b. The sensor control chip 20 has a function of sealing and protecting the movable structure 15 and restricting the movable portion 14a to move in the arrow direction b, in addition to the function as the chip described above.

When the sensor control chip 20 is mounted on the acceleration sensor chip 11, the second groove portions 30b are connected to the first groove portions 30a to form groove portions 30. Side wiring portions 32 are disposed in the groove portions 30. The side wiring portions 32 are preferably formed of copper (Cu) or nickel (Ni). In the embodiment, the side wiring portions 32 are disposed in an exposed state, and may be sealed with a sealing resin for protection.

As shown in FIGS. 10(A), 10(B), and 11(B), the electrode pad 18 of the acceleration sensor chip 11 formed of the first electrode pads 18a and the second electrode pads 18b are electrically connected to the side wiring portions 32 through upper wiring portions 33 one to one. That is, one end of the upper wiring portion 33 is connected to the electrode pad 18, and the other end of the upper wiring portion 33 is connected to a first end portion 32a of the side wiring portion 32. The upper wiring portions 33 extend on the outer region 13a, i.e., the upper surface 13b.

Lower wiring portions 34 are disposed on the first surface 20a of the sensor control chip 20. One end of the lower wiring portion 34 is connected to a second end portion 32b of the side wiring portion 32. Re-wiring portions 36 disposed on the first surface 20a of the sensor control chip 20. One end of the re-wiring portion 36 is connected to the sensor control electrode pad 22. The lower wiring portions 34 and the re-wiring portions 36 may be integrated, and are preferably formed of a metal wiring such as copper (Cu). Both of the other ends of the lower wiring portion 34 and the re-wiring portion 36 or the other end of the lower wiring portion 34 are connected to the outer terminal 70. The outer terminals 70 are disposed on the first surface 20a of the sensor control chip 20.

Accordingly, the outer terminals 70 are electrically connected to the piezo-resistance elements 19 through the lower wiring portions 34, the side wiring portions 32 connected to the lower wiring portions 34, and wiring portions (not shown) connected to the side wiring portions 32. Further, the outer terminals 70 are electrically connected to the sensor control chip 20 through the re-wiring portions 36 and the sensor control electrode pads 22 connected to the re-wiring portions 36.

In the embodiment, the outer terminal 70 is formed of the electrode post 40 electrically connected to both of the other ends of the lower wiring portion 34 and the re-wiring portion 36 or the other end of the lower wiring portion 34, and the solder ball 60 electrically connected to the top surface 40a of the electrode post 40. The outer terminals 70 function as a terminal for inputting and outputting a signal from an mounting substrate and an external device for the operation of the acceleration sensor chip, a signal applied to a power source, or a signal from the acceleration sensor chip package 10.

The substrate 12 is attached to the upper surface of the acceleration sensor chip 11. The substrate 12 is provided with recess portions 12b covering the opening portions 16 from above. The recess portion 12b is separated from the movable structure 15 and connected to the outer region 13a, so that the movable structure 15 is sealed and capable of operating. The recess portions 12b is separated by a distance C or greater to secure a specific displacement of the movable portion 14b in the arrow direction a shown in FIG. 10(B). As a result, the movable structure 15 is sealed in a closed space surrounded by the substrate 12 and the sensor control chip 20. The substrate 20 is preferably formed of a glass substrate.

The sealing portion 50 is disposed on the lower surface 20a of the sensor control chip 20, such that the outer terminals 70 are exposed. The sealing portion 50 seals the second end portions 32b of the side wiring portions 32, the re-wiring portions 36, the sensor control electrode pads 22, and the lower wiring portions 34. The outer terminals 70, i.e., the top surfaces 40a of the electrode posts 40 and the solder balls 60, are exposed from the sealing portion 50.

In the embodiment, the outer terminal 70 is formed of the electrode post 40 electrically connected to the other end of the wiring portion 17a and the solder ball 60 electrically connected to a top surface 40a of the electrode post 40. The solder ball 60 is formed of an arbitral material such as a lead-free solder ball and a core-ball. Alternatively, the outer terminal 70 may be formed in a land shape without the solder ball 60. That is, the outer terminal 70 may be formed in an appropriate shape according to a requirement of a mounting substrate on which the acceleration sensor chip package 10 is mounted. For example, when the electrode post 40 is formed of copper, a thin layer formed of nickel (Ni) may be formed on the top surface 40a of the electrode post 40. Then, a thin layer formed of gold (Au) is formed on the nickel thin layer. Alternatively, a solder paste is applied to the top surface 40a to form a land.

In the acceleration sensor chip package 10 of the present invention, without a protection cover conventionally used for sealing an acceleration sensor chip and bonding wires, it is possible to form the acceleration sensor chip package 10 having a size same as that of the chip while retaining the outer terminals, thereby greatly reducing the outer side of the package, and improving design flexibility in an arrangement of the outer terminals. Accordingly, it is possible to provide the package with a higher function and higher value, i.e., the function of the sensor control chip.

An operation of the acceleration sensor chip package 10 will be explained next. A signal input from an external device is input to the sensor control chip 20 through the outer terminals 70, the re-wiring portions 36, and the sensor control electrode pads 22. According to the signal, the sensor control chip 20 sends a control signal to the acceleration sensor chip 11 through the sensor control electrode pads 22, the lower wiring portions 34, the side wiring portions 32, the upper wiring portions 33, and the second electrode pads 18b for controlling the acceleration sensor chip 11.

In the embodiment, the sensor control electrode pads 22 of the sensor control chip 20 are directly connected to the second electrode pads 18b of the acceleration sensor chip 11. Accordingly, it is possible to exchange a signal between the sensor control chip 20 and the acceleration sensor chip 11 at a high speed.

When acceleration is applied to the acceleration sensor chip package 10, the movable portion 14b is displaced. Accordingly, the beam portion 14a supporting the movable portion 14b deforms by an amount proportional to the displacement of the movable portion 14b. The detection elements 19 disposed on the beam portion 14a detect the amount of the deformation as a change in resistance. The change in resistance is output to a detection circuit through the electrode pads 18 electrically connected to the detection elements 19 and the outer terminals 70, i.e., the electrode posts 40 and the solder balls 60. As a result, the acceleration applied to the acceleration sensor chip package 10 is measured quantitatively.

With reference to FIGS. 12(A) and 12(B) to 15, a method of producing the acceleration sensor chip package 10 will be explained next. In the invention, it is characterized that the acceleration sensor chip package is produced with the process technology of Wafer Level Chip Size Package (W-CSP), in which re-wiring, forming the outer terminals, sealing, and cutting in pieces are performed at a wafer level. In the following explanation, although a plurality of the acceleration sensor chips packages is arranged in a grid pattern and produced all at once at the wafer level, two adjacent acceleration sensor chips (packages) are shown for the sake of explanation.

Figure 12A:
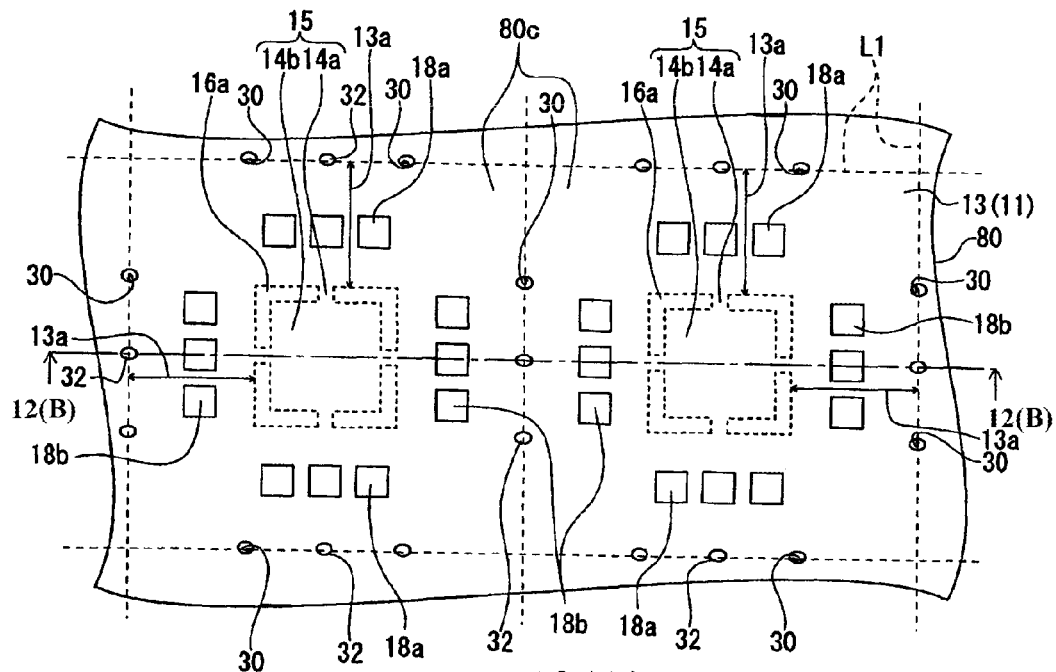
FIG. 12(A) is a schematic plan view showing the acceleration sensor chip package during a manufacturing process.
Figure 12B:
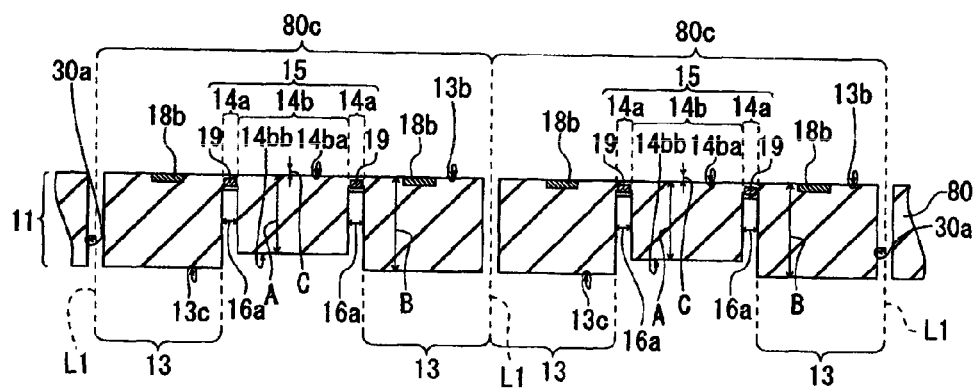
FIG. 12(B) is a sectional view taken along a projected line 12(B)-12(B) in FIG. 12(A)
Figure 13A:
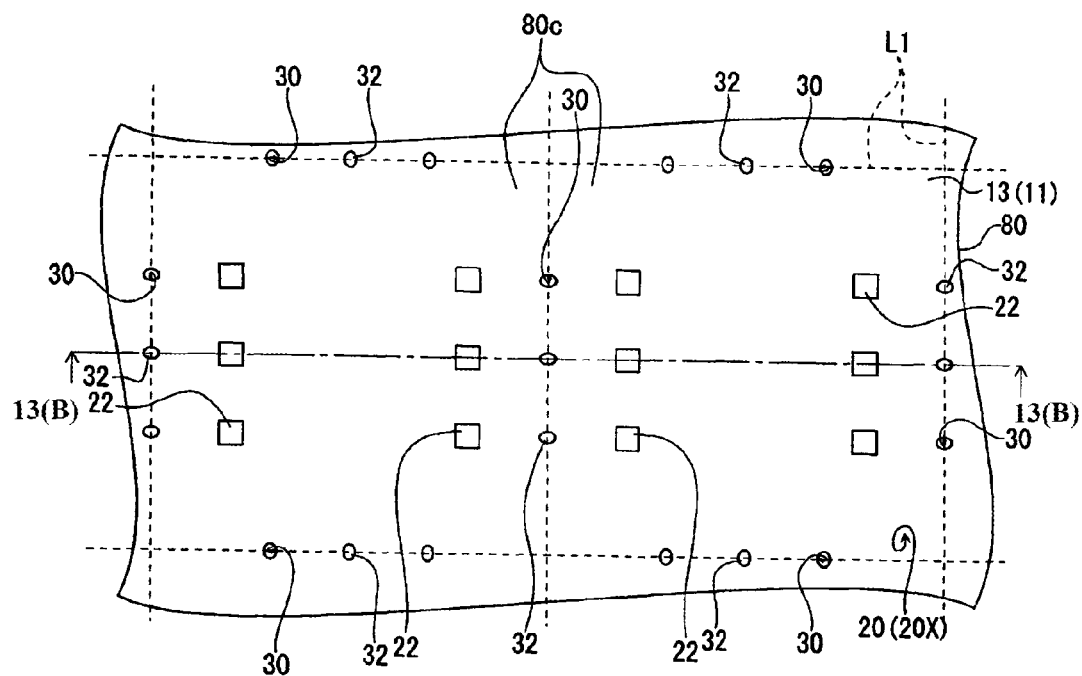
FIG. 13(A) is a schematic plan view showing the acceleration sensor chip package during the manufacturing process continued from FIG. 12(A)
Figure 13B:
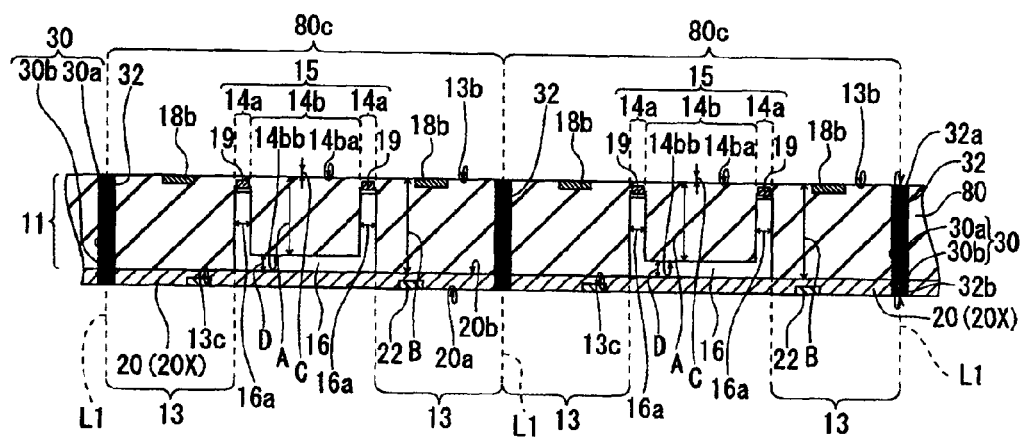
FIG. 13(B) is a sectional view taken along a projected line 13(B)-13(B) in FIG. 13(A)
Figure 14A:
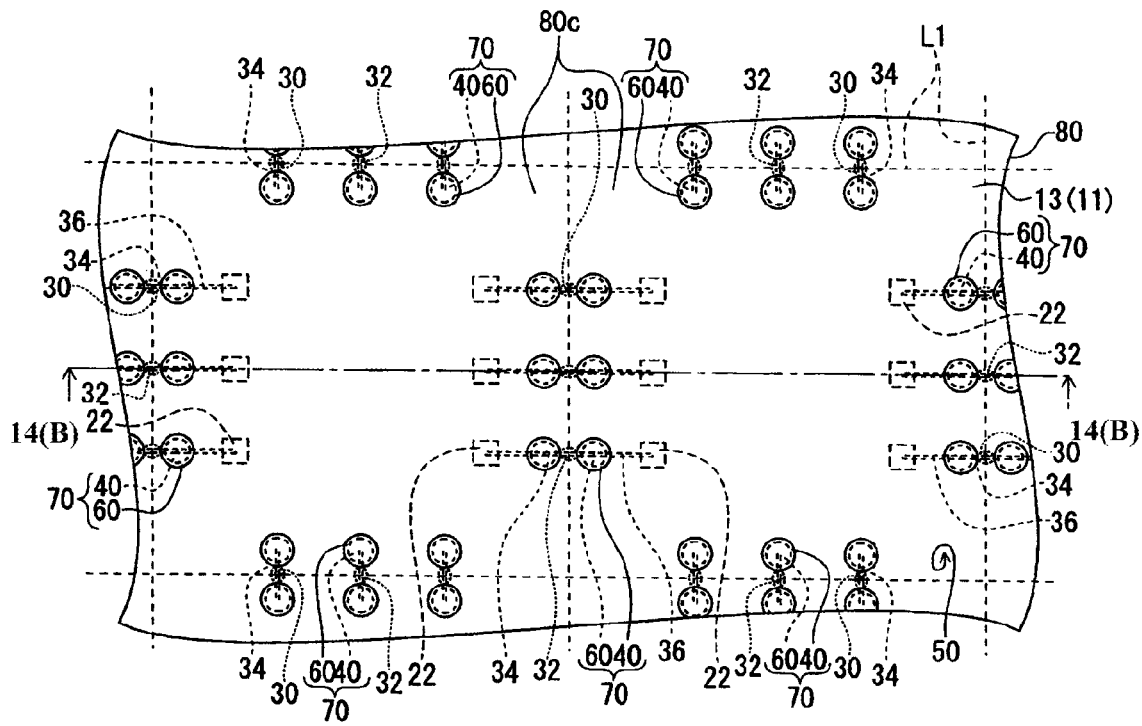
FIG. 14(A) is a schematic plan view showing the acceleration sensor chip package during the manufacturing process continued from FIG. 13(A)
Figure 14B:
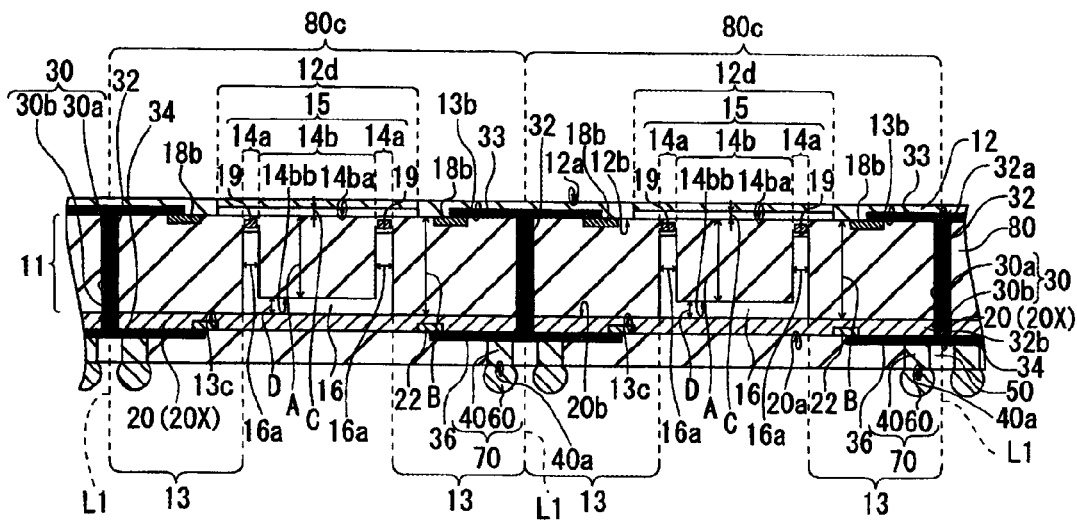
FIG. 14(B) is a sectional view taken along a projected line 14(B)-14(B) in FIG. 14(A)
Figure 15:
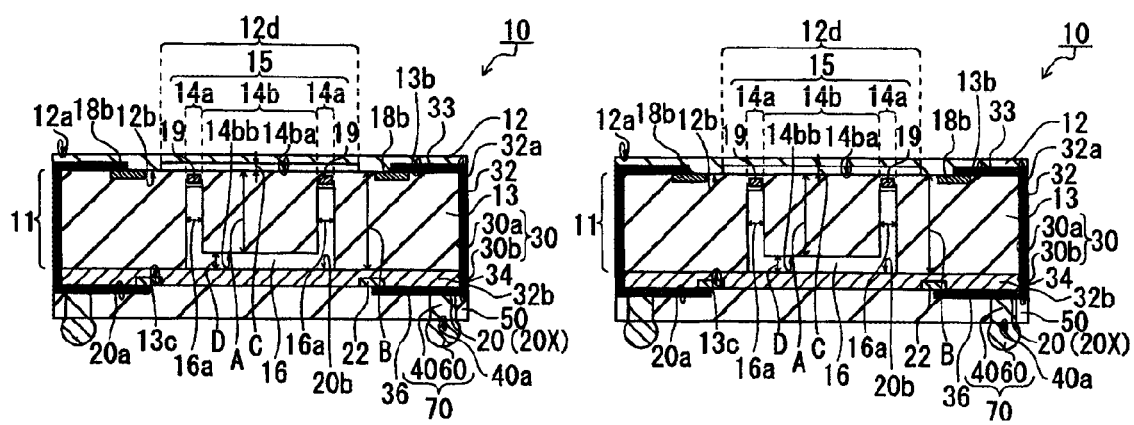
FIG. 15 is a schematic sectional view showing the acceleration sensor chip package upon completion of the manufacturing process.
Figure 16A:
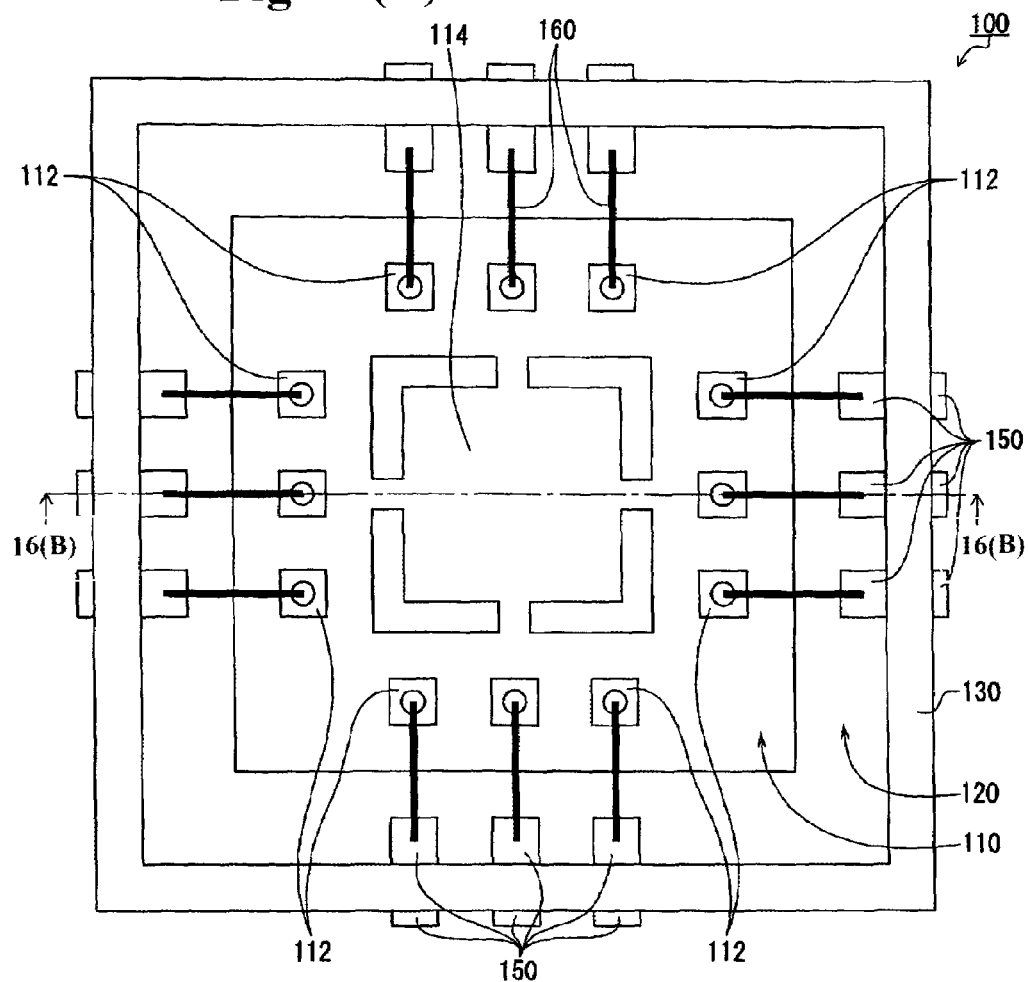
FIG. 16(A) is a schematic plan view showing a conventional acceleration sensor chip package for explaining constituents thereof.
Figure 16B:
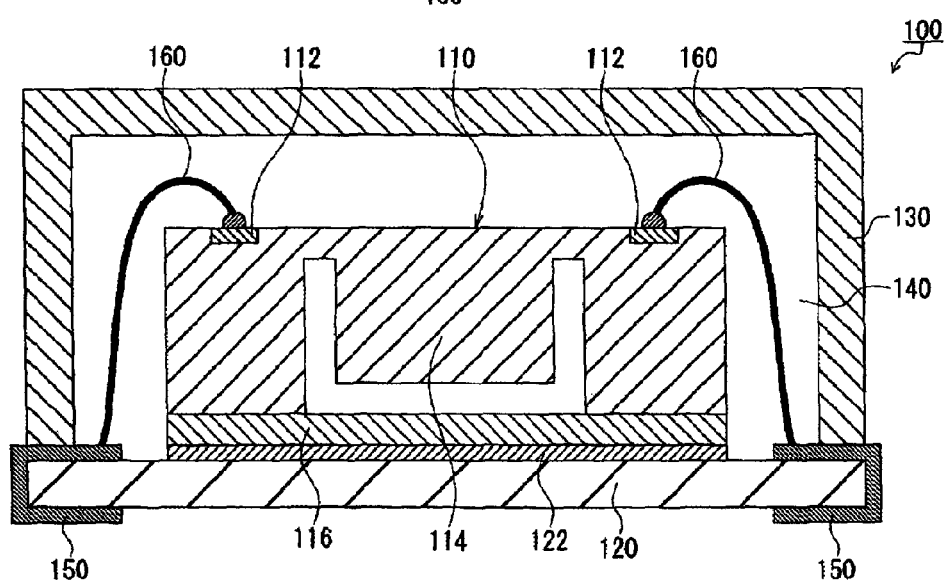
FIG. 16(B) is a sectional view taken along a projected line 16(B)-16(B) in FIG. 16(A)

FIG. 12(A) is a schematic plan view showing the acceleration sensor chip package during a manufacturing process, and FIG. 12(B) is a sectional view taken along a projected line 12(B)-12(B) in FIG. 12(A). FIG. 13(A) is a schematic plan view showing the acceleration sensor chip package during the manufacturing process continued from FIG. 12(A), and FIG. 13(B) is a sectional view taken along a projected line 13(B)-13(B) in FIG. 13(A). FIG. 14(A) is a schematic plan view showing the acceleration sensor chip package during the manufacturing process continued from FIG. 13(A), and FIG. 14(B) is a sectional view taken along a projected line 14(B)-14(B) in FIG. 14(A). FIG. 15 is a schematic sectional view showing the acceleration sensor chip package during the manufacturing process continued from FIG. 4(A).

As shown in FIGS. 12(A) and 12(B), first, the silicon wafer 80 is prepared. The silicon wafer 80 has the first surface 80a and the second surface 80b opposite to the first surface 80a. A plurality of the chip regions 80c is defined on the silicon wafer 80 in advance. The chip regions 80c eventually become the acceleration sensor chip packages 10 through a process of cutting in pieces (described later). Hidden lines L1 defining the chip regions 80c are scribe lines (dicing lines).

In the next step, a plurality of chip through holes 30a extending from the upper surface 13b of the frame portion 13 to the lower surface 13c is formed on the scribe lines L1 with a known method. In the embodiment, the chip through holes 30a have an oval section taken perpendicular to the extending direction thereof, and may have a circular section or a rectangular section. The chip through holes 30a are formed on the scribe lines L1 such that the chip through holes 30a are divided into symmetrical shapes vertically or horizontally with the scribe lines L1. The oval section is defined with two parallel lines with both ends connected in a curved shape.

In the next step, the silicon wafer 80 is processed with a known photolithography process and a known etching process to integrally form the movable structures 15. That is, the movable structures 15 having an essential function of the acceleration sensor are formed in the chip regions 80c. The movable structures 15 thus formed in the silicon wafer are also called an intermediate movable structure. As described above, the movable structure 15 includes the movable portion 14b and the beam portion 14a supporting the movable portion 14b. The bottom surface 14bb of the movable portion 14b is processed with a known photolithography process and a known etching process to form a proper shape (bottom shape), so that the beam portion 14a has an appropriate thickness, and the distance D is formed to secure a specific displacement of the movable structure 15 of the acceleration sensor chip 11. Specific constituents of the acceleration sensor chip 11 including the intermediate movable structure 15 are formed with a known process, and detailed explanations thereof are omitted.

The detection elements 19, i.e., the piezo-resistance elements 19 in the embodiment, are formed with a known wafer process at specific positions of the beam portion 14a for detecting acceleration. Wirings (not shown) formed of aluminum are provided with a known process such that one end portions thereof are connected to the piezo-resistance elements 19. The other end portions of the wirings extend to outer areas outside the intermediate movable structure 15, i.e., appropriate positions on the frame portion 13 (described later), in the chip region 80c. The wirings are covered with an insulating layer. The electrode pads 18 exposed from the surface of the frame portion 13 are electrically connected to the other end portions of the wirings (not shown). The electrode pads 18 may be formed such that parts of the wirings are exposed from the insulating layer formed on the upper surface of the frame portion 13 of the acceleration sensor chip 11.

In the next step, a first substrate 20X is prepared. A plurality of sensor control chips 20 is formed on the first substrate 80 in a matrix pattern. The sensor control chips 20 are defined with scribe lines L1 similar to those for defining the acceleration sensor chips 11. The sensor control chips 20 formed in the first substrate 20X may be called intermediate sensor control chips. The sensor control chip 20 has the first surface 20a and the second surface 20b opposite to the first surface 20a. A plurality of the sensor control electrode pads 22 is disposed on the first surface 20a in an exposed state.

In the next step, a plurality of control chip through holes 30b extending from the first surface 20a to the second surface 20b opposite to the first surface 20a is formed on the scribe lines L1 with a known method, so that the control chip through holes 30b communicate with the chip through holes 30a in an attaching process (described later). Similar to the chip through holes 30a, a section of the control chip through holes 30a is nit limited to a particular shape. The control chip through holes 30b preferably have a section same as that of the chip through holes 30a.

As shown in FIG. 13(B), the second surface 20b of the first substrate 20X is attached to the lower surface 13c of the frame portion 13, so that the intermediate acceleration sensor chips 11 face the intermediate sensor control chips 20. The first substrate 20X is fixed to the semiconductor substrate 80 with a known adhesive while the control chip through holes 30b communicate with the chip through holes 30a. The control chip through holes 30b communicating with the chip through holes 30a may be called through holes 30.

In the embodiment, the control chip through holes 30b communicate with the chip through holes 30a when the first substrate 20X is fixed to the semiconductor substrate 80. Alternatively, after the two substrates are fixed, the through holes 30 may be formed in one step, thereby obtaining secure conductivity.

In the next step, the through holes 30, i.e., the chip through holes 30a and the control chip through holes 30b communicating with the chip through holes 30a, are filled with a conductive material. The through holes 30 filled with the conductive material may be called intermediate side wiring portions 32. The intermediate side wiring portions 32 are formed into the side wiring portions 32 in a dicing step (described later). The conductive material includes copper or nickel as long as the material does not interfere the dicing step.

In the next step, the upper wiring portions 33 are formed on the outer region 13a, i.e., the upper surface 13b outside the opening portions 16, with a known wiring process. The electrode pads 18, i.e., the first electrode pads 18a and the second electrode pads 18b, are connected to the first end portions 32a of the intermediate side wiring portions 32 through the upper wiring portions 33. That is, one end of the upper wiring portion 33 is electrically connected to the electrode pad 18, and the other end thereof is connected to the first end portion 32a of the intermediate side wiring portion 32.

In the next step, as shown in FIGS. 14(A) and 14(B), a second substrate 12 is attached to an area of the semiconductor substrate 80 except the movable structures 15, i.e., the upper surface 13b of the frame portion 13. The second substrate 12 is provided with the recess portions 12b in the lower surface 12b for covering the opening portions 16 of the acceleration sensor chips 11 from above. The recess portions 12b are formed in the second substrate 12 formed of a flat glass substrate with etching. That is, the recess portions 12b individually seal the movable structures 15 to be capable of operating.

In the next step, the lower wiring portions 34 and the re-wiring portions 36 are formed on the frame portions 13 with a method similar to a manufacturing process of a re-wiring layer in the manufacturing process of so-called W-CSP. The lower wiring portions 34 and the re-wiring portions 36 are preferably formed of copper (Cu). The re-wiring portions 36 are formed on the first surface 20a of the sensor control chip 20, and one end of each of the re-wiring portions 36 is connected to the sensor control electrode pad 22. The lower wiring portions 34 and the re-wiring portions 36 may be integrated. That is, the lower wiring portions 34 and the re-wiring portions 36 may be formed in a common wiring layer with a method similar to a manufacturing process of a re-wiring layer of so-called W-CSP.

Specifically, first, a metal layer is formed on the first surface 20a. The metal layer is formed in a wiring pattern with known photolithography technology. Then, the electrode posts 40 are formed on the other ends of the re-wiring portions 36. In this process, after a conductive material such as copper is plated with a resist layer patterned with a known photolithography as a mask, the resist layer is removed. In the photolithography process, the resist layer is formed of a dry-developing resist, so that a dry developing process is performed. In the embodiment, the electrode posts 40 have a column shape having a circular section taken perpendicular to an extending direction (upper-to-lower direction in FIG. 14(B)).

In the next step, the sealing portion 50 is formed on the first surface 20a of the sensor control chip 20 using, for example, a liquid sealing resin such as an epoxy-type mold resin and a liquid sealing material, so that only the top surfaces 40a of the electrode posts 40 are exposed. The sealing process is performed with a known process such as a transfer molding method, and a printing method.

The sealing portion 50 may be formed to cover the top surfaces 40a of the electrode posts 40, and then the top surfaces 40a of the electrode posts 40 are ground to expose from the sealing portion 50. The sealing portion 50 may be formed with a film forming method. In this case, during the sealing process, it is possible to reduce a load applied to the electrode posts 40. It is also possible to expose the top surfaces 40a of the electrode posts 40 from the sealing portion 50 without the grinding process.

The top surfaces 40a of the electrode posts 40 may be treated with an appropriate process. For example, when the electrode posts 40 are formed of copper, a thin nickel (Ni) layer or a thin gold (Au) layer may be formed on the top surfaces 40a of the electrode posts 40.

In the next step, as shown in FIGS. 14(A) and 14(B), the solder balls 60 are disposed on the top surfaces 40a of the electrode posts 40. In the embodiment, the outer terminals 70 are formed of the electrode posts 40 and the solder balls 60.

Alternatively, the outer terminals 70 may be formed of a planer structure such as a land in which parts of the lower wiring portions 34 or the re-wiring portions 36 are exposed from the sealing portion 50 without using the electrode posts 40. After this step, the acceleration sensor chip packages 10 are completely packaged at the wafer level.

In the next step, the dicing process is performed on the areas between the acceleration sensor chips 11 along the scribe lines L1 with a known dicing machine to cut the sealing portion 50, the semiconductor substrate 80 and the first and second substrate 20X and 12. With the dicing process, the intermediate side wiring portions 32 are cut and exposed from a cut surface in a stripe pattern as the side wiring portions 32. Accordingly, as shown in FIG. 15, it is possible to produce a plurality of the acceleration sensor chip packages 10 having an identical structure from one single wafer.

In the method of producing the acceleration sensor chip packages 10 according to the embodiment of the present invention, the outer terminals 70 are formed at the appropriate positions with the W-CSP process. It is also possible to efficiently produce the acceleration sensor chip packages 10 having a shape same as that of the acceleration sensor chip 11 in a plan view. It is unnecessary to provide an additional production line, and it is possible to produce the acceleration sensor chip packages 10 with cost substantially same as that of producing a conventional semiconductor device.

While the invention has been explained with reference to the specific embodiments of the invention, the explanation is illustrative and the invention is limited only by the appended claims.

What is claimed is:

1. An acceleration sensor chip package, comprising:

an acceleration sensor chip including a frame portion having an upper surface, a lower surface opposite to the upper surface, an inner region, and an outer region surrounding the inner region, an opening portion formed in the inner region and extending from the upper surface to the lower surface, a movable structure having a beam portion extending from the frame portion toward inside the opening portion and a movable portion disposed in the opening portion and supported on the beam portion to be movable, a detection element for detecting a movement of the movable structure, and an electrode pad electrically connected to the detection element and disposed in the outer region;

a sensor control chip having a first surface, a second surface opposite to the first surface, and a sensor control electrode pad disposed from the first surface, said second surface being attached to the lower surface of the frame portion;

an upper wiring portion extending on the outer region and having one end connected to the electrode pad electrically connected to the detection element;

a groove portion having a first groove portion and a second groove portion disposed in a side surface of the sensor control chip, said first groove portion extending from the upper surface to the lower surface of the frame portion, said second groove portion connected to the first groove portion and extending from the first surface to the second surface of the sensor control chip;

a side wiring portion disposed in the groove portion and having a first end and a second end, said first end being electrically connected to the other end of the upper wiring portion;

a lower wiring portion extending on the first surface of the sensor control chip and having one end connected to the second end of the side wiring portion;

a re-wring portion extending on the first surface of the sensor control chip and having one end connected to the electrode pad;

an outer terminal disposed on the first surface of the sensor control chip and connected to at least one of the other end of the lower wiring portion and the other end of the re-wiring portion;

a sealing portion for sealing the sensor control chip such that the outer terminal is exposed; and a substrate having a recess portion for covering the movable structure and attached to the upper surface of the acceleration sensor chip such that the recess portion is situated above the movable structure.

2. The acceleration sensor chip package according to claim 1, wherein said side wiring portion is arranged such that the side wiring portion is exposed from a side surface of the frame portion.

* * * * *